United States Patent
Takada et al.

(10) Patent No.: US 8,823,141 B2
(45) Date of Patent: Sep. 2, 2014

(54) SEMICONDUCTOR WAFER, METHOD OF PRODUCING SEMICONDUCTOR WAFER, ELECTRONIC DEVICE, AND METHOD OF PRODUCING ELECTRONIC DEVICE

(75) Inventors: Tomoyuki Takada, Tsukuba (JP); Masahiko Hata, Tsuchiura (JP); Sadanori Yamanaka, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 198 days.

(21) Appl. No.: 13/255,648

(22) PCT Filed: Mar. 8, 2010

(86) PCT No.: PCT/JP2010/001621
§ 371 (c)(1),
(2), (4) Date: Sep. 9, 2011

(87) PCT Pub. No.: WO2010/103792
PCT Pub. Date: Sep. 16, 2010

(65) Prior Publication Data
US 2011/0316051 A1    Dec. 29, 2011

(30) Foreign Application Priority Data

Mar. 11, 2009  (JP) ................. 2009-058730

(51) Int. Cl.
*H01L 29/20* (2006.01)
*H01L 21/02* (2006.01)

(52) U.S. Cl.
USPC ............. 257/615; 257/190; 257/E27.012

(58) Field of Classification Search
CPC .............. H01L 21/02447; H01L 21/02452; H01L 21/02538; H01L 21/02645; H01L 21/2056
See application file for complete search history.

(56) References Cited

U.S. PATENT DOCUMENTS

| 4,547,231 A | 10/1985 | Hine |
| 4,614,564 A | 9/1986 | Sheldon et al. |

(Continued)

FOREIGN PATENT DOCUMENTS

| JP | 60-210831 A | 10/1985 |
| JP | 61-094318 A | 5/1986 |

(Continued)

OTHER PUBLICATIONS

First Office Action issued May 28, 2013 in Chinese Patent Application No. 201080010719.3 to Sumitomo Chemical Co., Ltd. with translation.

(Continued)

*Primary Examiner* — Daniel Luke
(74) *Attorney, Agent, or Firm* — Sughrue Mion, PLLC

(57) ABSTRACT

The semiconductor wafer includes: a base wafer; and an inhibition layer that is disposed on the base wafer as one piece or to be separate portions from each other, and inhibits growth of a crystal of a compound semiconductor, where the inhibition layer has a plurality of first opening regions that have a plurality of openings penetrating the inhibition layer and leading to the base wafer, each of the plurality of first opening regions includes therein a plurality of first openings disposed in the same arrangement, some of the plurality of first openings are first element forming openings each provided with a first compound semiconductor on which an electronic element is to be formed, and the other of the plurality of first openings are first dummy openings in which no electronic element is to be formed.

18 Claims, 24 Drawing Sheets

(56) References Cited

U.S. PATENT DOCUMENTS

| | | |
|---|---|---|
| 6,190,975 B1 | 2/2001 | Kubo et al. |
| 6,377,596 B1 | 4/2002 | Tanaka et al. |
| 2002/0171089 A1* | 11/2002 | Okuyama et al. ............... 257/88 |
| 2003/0143765 A1* | 7/2003 | Ishibashi et al. ................ 438/21 |
| 2008/0070355 A1 | 3/2008 | Lochtefeld et al. |
| 2008/0149935 A1* | 6/2008 | Lee ................. 257/72 |
| 2009/0022452 A1* | 1/2009 | Welch et al. .................... 385/14 |
| 2009/0242935 A1* | 10/2009 | Fitzgerald .................... 257/187 |
| 2010/0308376 A1 | 12/2010 | Takada et al. |
| 2011/0006343 A1 | 1/2011 | Hata et al. |
| 2011/0006368 A1 | 1/2011 | Hata et al. |
| 2011/0006399 A1 | 1/2011 | Takada et al. |
| 2011/0012175 A1 | 1/2011 | Takada et al. |
| 2011/0018030 A1 | 1/2011 | Takada et al. |
| 2011/0037099 A1 | 2/2011 | Takada et al. |
| 2011/0180849 A1 | 7/2011 | Hata |
| 2011/0180903 A1 | 7/2011 | Hata |
| 2011/0180949 A1 | 7/2011 | Bierdel et al. |
| 2011/0186911 A1 | 8/2011 | Hata |
| 2011/0266595 A1 | 11/2011 | Hata |
| 2012/0104461 A1 | 5/2012 | Leitz et al. |

FOREIGN PATENT DOCUMENTS

| | | |
|---|---|---|
| JP | 61-135115 A | 6/1986 |
| JP | 61-188927 A | 8/1986 |
| JP | 63-158832 A | 7/1988 |
| JP | 63-236313 A | 10/1988 |
| JP | 2-083943 A | 3/1990 |
| JP | 2-228025 A | 9/1990 |
| JP | 03-085730 A | 4/1991 |
| JP | 6-077127 A | 3/1994 |
| JP | 8-203833 A | 8/1996 |
| JP | 10-214906 A | 8/1998 |
| JP | 11-214457 A | 8/1999 |
| JP | 11-345812 A | 12/1999 |
| JP | 2003-309331 A | 10/2003 |
| JP | 2005-536876 A | 12/2005 |

OTHER PUBLICATIONS

Office Action, with English translation, issued Feb. 12, 2014 in Japanese Patent Application 2010- 052646.

* cited by examiner

SEMICONDUCTOR WAFER, METHOD OF PRODUCING SEMICONDUCTOR WAFER, ELECTRONIC DEVICE, AND METHOD OF PRODUCING ELECTRONIC DEVICE

CROSS REFERENCE TO RELATED APPLICATIONS

This application is a National Stage of International Application No. PCT/JP2010/001621, filed on Mar. 8, 2010, which claims priority from Japanese Patent Application No. 2009-058730, filed Mar. 11, 2009, the contents of all of which are incorporated herein by reference in their entirety.

TECHNICAL FIELD

The present invention relates to a semiconductor wafer, a method of producing a semiconductor wafer, an electronic device, and a method of producing an electronic device.

BACKGROUND ART

Recently, semiconductor devices using Group 3-5 compound semiconductors such as GaAs in an active region have been developed. For example, Patent Document 1 discloses a compound semiconductor epitaxial wafer in which crystal thin films of a buffer layer of AlGaAs and a channel layer of GaAs have been formed on a GaAs wafer.
Patent Document 1: JP11-345812 A

SUMMARY OF THE INVENTION

Problems to be Solved by the Invention

When using a crystal thin film in an active region of a semiconductor device, it is required to form the crystal thin film having a uniform quality and a uniform thickness on the semiconductor wafer. By selecting a deposition condition that yields a uniform quality and a uniform thickness at any position of the semiconductor wafer, the characteristics of the electronic elements formed in various positions on the semiconductor wafer can be uniform. However, the growth of a crystal thin film is affected by various phenomena such as thermal migration in the reaction chamber, the material transfer, the vapor phase reaction, and surface reaction of the sources or the reaction intermediate, which makes it difficult to design the deposition condition according to the positions of the electronic elements. Particularly in the selective growth by which semiconductors are selectively formed on part of a wafer, the growth rate of the crystal thin film often depends on the size, shape, etc. of the selective growth section, which makes designing and control even more difficult.

Moreover, after test production of electronic elements to be formed on a semiconductor wafer, it becomes occasionally necessary to change the arrangement of the crystal thin films in the semiconductor wafer depending on the characteristic of the electronic elements having been produced in the test production. When it becomes necessary to re-design the process condition or the like of the crystal thin film growth, it takes longer from the start of the design to the start of the production. Furthermore, optimization of the process condition or the like of the crystal thin film growth depending on the specification of the device to be formed on the crystal thin film is one factor contributing to increase in production cost.

Means for Solving the Problems

For a solution to the above-mentioned problems, according to the first aspect related to the present invention, provided is a semiconductor wafer including: a base wafer; and an inhibition layer that is disposed on the base wafer as one piece or to be separate portions from each other, and inhibits growth of a crystal of a compound semiconductor, where the inhibition layer has a plurality of first opening regions that have a plurality of openings penetrating the inhibition layer and leading to the base wafer, each of the plurality of first opening regions includes therein a plurality of first openings disposed in the same arrangement, some of the plurality of first openings are first element forming openings each provided with a first compound semiconductor on which an electronic element is to be formed, and the other of the plurality of first openings are first dummy openings in which no electronic element is to be formed.

For example, on the semiconductor wafer, (a) a second compound semiconductor having the same composition as that of the first compound semiconductor and (b) a first insulator disposed on the second compound semiconductor are disposed in at least some of the first dummy openings. A third compound semiconductor having the same composition as that of the first compound semiconductor and having a thickness smaller than the thickness of the first compound semiconductor may be disposed in at least some of the first dummy openings. No compound semiconductor having the same composition as that of the first compound semiconductor may be disposed in at least some of the first dummy openings.

For example, the plurality of first openings are arranged in a lattice pattern in the plurality of first opening regions. The plurality of first opening regions may be arranged at constant intervals. The plurality of first opening regions may be arranged in a lattice pattern, for example.

An example of the first compound semiconductor is a Group 3-5 compound semiconductor. The semiconductor wafer may have such a configuration that the base wafer is a Si wafer or an SOI wafer, a first seed crystal lattice-matching or pseudo lattice-matching the first compound semiconductor is further disposed on the base wafer inside the first element forming opening, and a crystal of the first compound semiconductor has been grown on the first seed crystal. The first seed crystal includes $C_xSi_yGe_zSn_{1-x-y-z}$ ($0 \leq x \leq 1$, $0 \leq y \leq 1$, $0 \leq z \leq 1$, and $0 \leq x+y+z \leq 1$).

The inhibition layer may further include a second opening region that includes a plurality of second openings penetrating the inhibition layer and leading to the base wafer, the plurality of second openings being disposed in an arrangement different than the arrangement of the plurality of first openings disposed in the plurality of first opening regions. Some of the plurality of second openings may be second element forming openings in which a fourth compound semiconductor is disposed, the fourth compound semiconductor being formed in the same process as the first compound semiconductor and on which an electronic element can be formed, and the other of the plurality of second openings may be second dummy openings in which no electronic element is to be formed.

The semiconductor wafer may have such a configuration that the base wafer is a Si wafer or an SOI wafer, a second seed crystal lattice-matching or pseudo lattice-matching the fourth compound semiconductor is disposed on the base wafer inside the second element forming opening, and the fourth compound semiconductor has been grown on the second seed crystal. For example, the second seed crystal includes $C_xSi_yGe_zSn_{1-x-y-z}$ ($0 \leq x \leq 1$, $0 \leq y \leq 1$, $0 \leq z \leq 1$, and $0 \leq x+y+z \leq 1$).

According to the second aspect related to the present invention, provided is a method for producing a semiconductor wafer, including: preparing a base wafer; disposing an inhibition layer on the base wafer as one piece or to be separate portions from each other, the inhibition layer being to inhibit growth of a crystal of a compound semiconductor; forming, in the inhibition layer, a plurality of opening regions that have a plurality of openings penetrating the inhibition layer and leading to the base wafer; growing a crystal of the compound semiconductor inside the plurality of openings; and removing at least part of the compound semiconductor having been grown in a dummy opening of the plurality of openings, in which dummy opening no electronic element is to be formed, where each of the plurality of opening regions includes therein a plurality of openings disposed in the same arrangement.

In forming the plurality of opening regions, the plurality of openings are arranged in a lattice pattern, for example. In forming the plurality of opening regions, the plurality of opening regions may be arranged at constant intervals. In forming the plurality of opening regions, the plurality of opening regions may also be arranged in a lattice pattern.

The base wafer may be a Si wafer or an SOI wafer, and the method may further comprise, prior to growing a crystal of the compound semiconductor, disposing, on the base wafer, a seed crystal lattice-matching or pseudo lattice-matching the compound semiconductor. The seed crystal may include a $C_xSi_yGe_zSn_{1-x-y-z}$ crystal ($0 \leq x \leq 1$, $0 \leq y \leq 1$, $0 \leq z \leq 1$, and $0 \leq x+y+z \leq 1$). In disposing the seed crystal, the $C_xSi_yGe_zSn_{1-x-y-z}$ crystal ($0 \leq x \leq 1$, $0 \leq y \leq 1$, $0 \leq z \leq 1$, and $0 \leq x+y+z \leq 1$) is annealed, after or during the growth of the $C_xSi_yGe_zSn_{1-x-y-z}$ crystal ($0 \leq x \leq 1$, $0 \leq y \leq 1$, $0 \leq z \leq 1$, and $0 \leq x+y+z \leq 1$), for example.

According to the third aspect related to the present invention, provided is a method for producing a semiconductor wafer, including: preparing a base wafer; disposing an inhibition layer on the base wafer as one piece or to be separate portions from each other, the inhibition layer being to inhibit growth of a crystal of a compound semiconductor; forming, in the inhibition layer, a plurality of opening regions that have a plurality of openings penetrating the inhibition layer leading to the base wafer; growing a crystal of the compound semiconductor inside the plurality of openings; and disposing an insulator on a compound semiconductor having been grown in a dummy opening of the plurality of openings, in which dummy opening no electronic element is to be formed, where each of the plurality of opening regions includes therein a plurality of openings disposed in the same arrangement.

According to the fourth aspect related to the present invention, provided is an electronic device in which an electronic element is formed on the first compound semiconductor of the semiconductor wafer including: a base wafer; and an inhibition layer that is disposed on the base wafer as one piece or to be separate portions from each other, and inhibits growth of a crystal of a compound semiconductor, where the inhibition layer has a plurality of first opening regions that have a plurality of openings penetrating the inhibition layer and leading to the base wafer, each of the plurality of first opening regions includes therein a plurality of first openings disposed in the same arrangement, some of the plurality of first openings are first element forming openings each provided with a first compound semiconductor on which an electronic element is to be formed, and the other of the plurality of first openings are first dummy openings in which no electronic element is to be formed.

For example, the electronic device includes a plurality of the first compound semiconductors are included, each of first compound semiconductors being provided with an electronic element, and the electronic device may further include: an interconnection electrically coupling the electronic elements to each other; a second compound semiconductor disposed in at least some of the first dummy openings, the second compound semiconductor having the same composition as that of the first compound semiconductor; and an insulator that is disposed on the second compound semiconductor and insulates the second compound semiconductor from the interconnection. A test element for testing the electronic element may be formed in a region of the base wafer, the region being different from the plurality of first opening regions.

The electronic element is at least one electronic element selected from the group consisting of an amplifying element, a switching element, an integrated circuitry element that constitutes an integrated circuit, a light emitting element that converts electricity into light, and a light receiving element that outputs a voltage or a current according to received light, for example. The base wafer may be a Si wafer or an SOI wafer, the electronic device may further include: one or more silicon elements formed on a silicon crystal of the Si wafer or the SOI wafer, and at least one of the silicon elements and at least one of the electronic elements may be electrically coupled.

According to the fifth aspect related to the present invention, provided is a method for producing an electronic device, including: preparing a base wafer; disposing an inhibition layer on the base wafer as one piece or to be separate portions from each other, the inhibition layer being to inhibit growth of a crystal of a compound semiconductor; forming, in the inhibition layer, a plurality of opening regions that have a plurality of openings penetrating the inhibition layer and leading to the base wafer; growing a crystal of the compound semiconductor inside the plurality of openings; removing at least part of the compound semiconductor having been grown in a dummy opening of the plurality of openings, in which dummy opening no electronic element is to be formed; and forming an electronic element on the compound semiconductor having been grown in an element forming opening in which an electronic element is to be formed, where each of the plurality of opening regions includes a plurality of openings disposed in the same arrangement. The base wafer may be a Si wafer or an SOI wafer, and the method may further include: prior to disposing the inhibition layer, forming a silicon element on the base wafer, the silicon element having an active region made of a silicon material; and forming an interconnection that electrically couples the silicon element with the electronic element.

According to the sixth aspect related to the present invention, provided is a method for producing an electronic device, including: preparing a base wafer; disposing an inhibition layer on the base wafer as one piece or to be separate portions from each other, the inhibition layer being to inhibit growth of a crystal of a compound semiconductor; forming, in the inhibition layer, a plurality of opening regions that have a plurality of openings penetrating the inhibition layer and leading to the base wafer; growing a crystal of the compound semiconductor inside the plurality of openings; disposing an insulator on a compound semiconductor having been grown in a dummy opening of the plurality of openings, in which dummy opening no electronic element is to be formed; and forming an electronic element on the compound semiconductor having been grown in an element forming opening in which an electronic element is to be formed, where each of the plurality of opening regions includes therein a plurality of openings disposed in the same arrangement.

MODE FOR CARRYING OUT THE INVENTION

Figure 1:
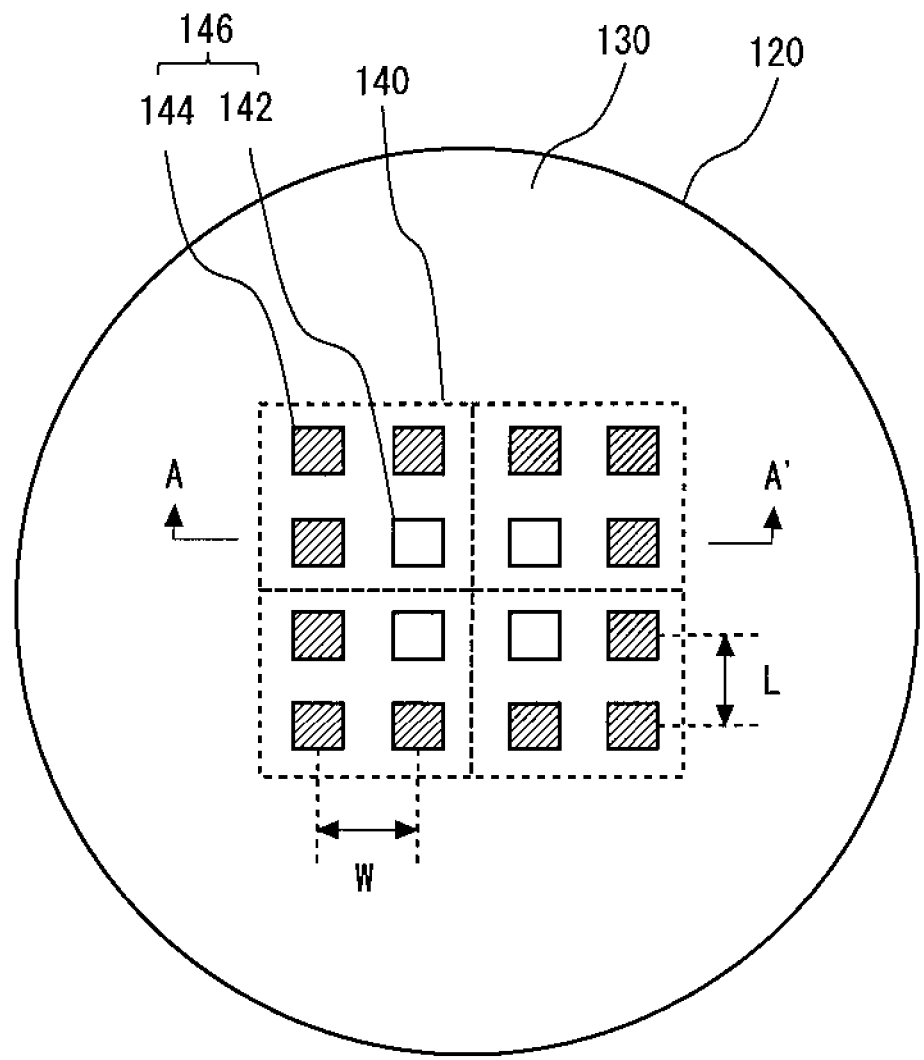
FIG. 1 schematically shows an exemplary plan view of a semiconductor wafer 110.

Some aspects of the invention will now be described based on the embodiments, which do not intend to limit the scope of the present invention, but exemplify the invention. All of the features and the combinations thereof described in the embodiment are not necessarily essential to the invention. Hereinafter, (some) embodiment(s) of the present invention will be described with reference to the drawings. In the drawings, the same or similar features are occasionally assigned the same reference numeral, and the overlapping explanation is omitted. Also note that the drawings are schematic representation, where the relation, the ratio or the like of the thickness and the planar size can be different from the actual ones. The relation or the ratio between the sizes can be different among the drawings, too, for facilitating explanation.

Figure 2:
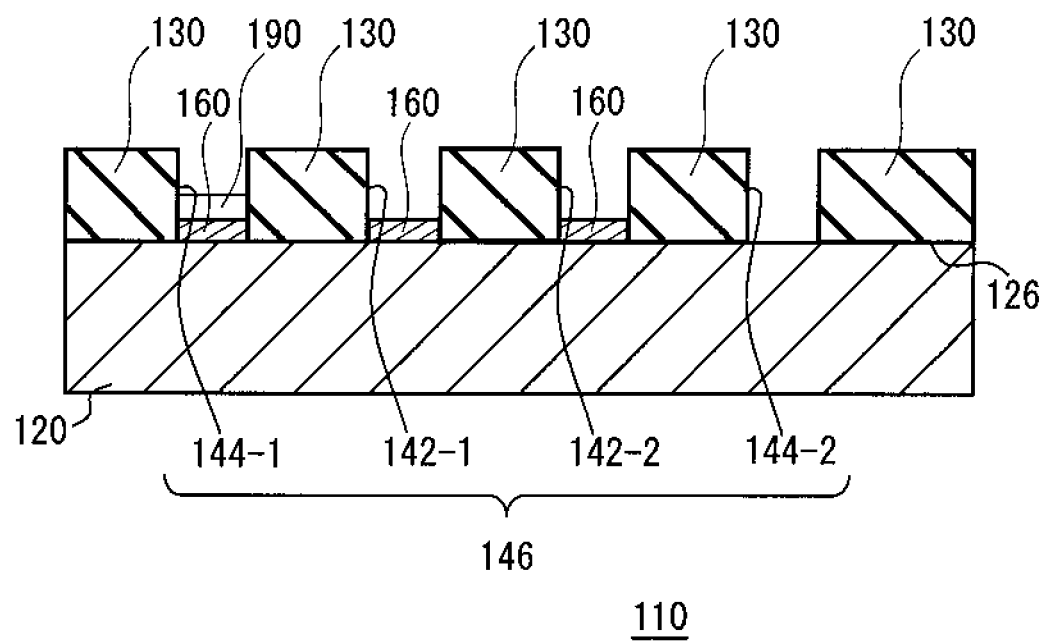
FIG. 2 shows a cross sectional view of the semiconductor wafer 110 shown in FIG. 1, taken at the line A-A'.

FIG. 1 schematically shows an exemplary plan view of a semiconductor wafer 110. FIG. 2 shows a cross sectional view of the semiconductor wafer 110 shown in FIG. 1, taken at the line A-A'. The semiconductor wafer 110 includes a base wafer 120 and an inhibition layer 130. The inhibition layer 130 is disposed on the base wafer 120 either as one piece or as separate portions from each other, thereby inhibiting the growth of the compound semiconductor.

When for example epitaxially growing a crystal of a compound semiconductor using a MOCVD method, the inhibition layer 130 inhibits the crystal of the compound semiconductor from growing on the surface of the inhibition layer 130. The inhibition layer 130 is for example a silicon oxide layer, aluminum oxide layer, a silicon nitride layer, a silicon oxynitride layer, a tantalum nitride layer, or a titanium nitride layer, or a layer made by stacking them. The thickness of the inhibition layer 130 is 0.05 to 5 μm for example. For example, the inhibition layer 130 is formed by CVD or sputtering.

In one example, the inhibition layer 130 is formed on the entire surface of the base wafer 120, as one piece. The inhibition layer 130 can be separate portions respectively disposed on a plurality of different regions of the base wafer 120. After formation on the entire surface of the base wafer 120, the inhibition layer 130 is separated into a plurality of regions by removing some regions by etching.

The inhibition layer 130 includes a plurality of opening regions 140. Specifically, in each of the plurality of opening regions 140, a plurality of openings 146 are disposed at the same positions across the plurality of opening regions 140, to penetrate the inhibition layer 130 leading to the base wafer 120. To be more specific, the figure formed by connecting the reference positions of the plurality of openings 146 in each of the opening regions 140 is the same across all the opening regions 140.

For example, the reference position of an element forming opening 142 is the center of the element forming opening 142. Note that the reference position of the element forming opening 142 can be the barycenter when the element forming opening 142 is assumed to be a cross section of a homogenous rigid body.

A crystal of a compound semiconductor can be selectively grown inside each opening 146. The opening 146 penetrates the inhibition layer 130 leading to the base wafer 120, in the stacking direction substantially vertical to a main plain of the base wafer 120. The opening 146 can be formed by photolithography such as etching.

Here, in the present specification, "substantially vertical direction" is not limited to the strictly vertical direction, and also includes directions slightly tilted from the vertical direction, taking into consideration the manufacturing errors of a wafer and each component. Note that "stacking direction" is the direction in which the inhibition layer 130 is stacked on the base wafer 120.

In the production process of the semiconductor wafer 110, the same compound semiconductor is grown in all the plurality of openings 146 in the same process. Some of the plurality of openings 146 are element forming opening(s) 142 in which a compound semiconductor on which an electronic element is to be formed is disposed. The other of the plurality of openings 146 are dummy openings 144 in which no electronic element is to be formed. In other words, electronic elements are formed on the compound semiconductors in the element forming openings 142. On the contrary, no electronic element is formed on the compound semiconductors in the dummy openings 144. An insulator can be disposed on the compound semiconductors in the dummy openings 144. The compound semiconductors in the dummy openings 144 can be removed.

Each opening region 140 in FIG. 1 includes four openings 146. An opening region 140 can include an arbitrary number of openings 146. The plurality of openings 146 are arranged regularly, for example. "arranging regularly" means that the distances among the reference positions of the plurality of element forming openings 142 are constant, or periodically change.

The plurality of openings 146 are arranged in a lattice pattern in each of the opening regions 140, for example. For example, the centers (i.e., reference positions) of the plurality of openings 146 are arranged in a straight line in a first direction, and also in a straight line in a second direction that is orthogonal to the first direction.

The plurality of openings 146 are arranged in a lattice pattern of rectangles each having the width of W and the length of L. The plurality of openings 146 can be arranged in a lattice pattern of squares in which the width W is equal to the length L, so that the distances among the squares are equal. The plurality of openings 146 can be arranged in a lattice pattern of parallelograms or rhombuses in which the first direction and the second direction intersect each other at an angle not orthogonal to each other. By a lattice pattern in which the plurality of openings 146 align at constant intervals in each of the first direction and the second direction, the qualities and the thicknesses of the compound semiconductors growing in the plurality of openings 146 can be made uniform.

The plurality of opening regions 140 are arranged at constant intervals, for example. The plurality of opening regions 140 are arranged in a lattice pattern. By arranging the plurality of opening regions 140 at constant intervals, the average density of the plurality of element forming openings 142 in the base wafer 120 can be uniform. As a result, the uniformity of the qualities and the thicknesses of the compound semiconductors growing in the plurality of element forming openings 142 can improve.

The semiconductor wafer 110 is produced by growing the same compound semiconductor in all of the plurality of element forming openings 142 in the same process. Therefore, even when any openings 146 are selected as element forming openings 142, the compound semiconductors in the selected element forming openings 142 will have the same quality and thickness. Accordingly, electronic elements to be formed in the semiconductor wafer 110 are formed on the homogeneous compound semiconductors. Consequently, the electronic elements formed in the plurality of element forming openings will have the same characteristics as each other.

When growing the same compound semiconductor in all the plurality of element forming openings 142 in the same process, the compound semiconductor can be grown under a single process condition. Therefore, regardless of the element forming openings 142 in which an electronic element is formed, the process step of setting a process condition for each combination of the positions of the element forming openings 142 in which an electronic element is formed can be eliminated. Consequently, a semiconductor wafer can be efficiently produced.

Note that it is desirable to arrange the element forming opening 142 to be surrounded by the dummy openings 144. By arranging the element forming opening 142 to be surrounded by the dummy openings 144, the quality and the thickness of the compound semiconductors grown in the plurality of element forming openings 142 can improve.

As shown in FIG. 2, the inhibition layer 130 is disposed on the main plane 126 of the base wafer 120. The inhibition layer 130 has a plurality of openings 146. Specifically, the inhibition layer 130 has an element forming opening 142-1, an element forming opening 142-2, a dummy opening 144-1, and a dummy opening 144-2.

For example, the base wafer 120 can be a Si wafer, an SOI (silicon-on-insulator) wafer, a Ge wafer, a GOI (germanium-on-insulator) wafer, a GaAs wafer, or a sapphire wafer. The Si wafer can be a single crystal Si wafer.

A first compound semiconductor 160 is disposed inside the element forming opening 142-1 and the element forming opening 142-2. An electronic element such as HBT (heterojunction bipolar transistor) and FET (field-effect transistor) is formed on the first compound semiconductor 160 disposed inside the element forming opening 142-1 and the element forming opening 142-2, for example.

The first compound semiconductor 160 is in contact with the main plane 126 of the base wafer 120. The first compound semiconductor 160 can have a plurality of layers containing a compound semiconductor. The first compound semiconductor 160 can be a Group 3-5 compound semiconductor. The first compound semiconductor 160 can include a $C_xSi_yGe_zSn_{1-x-y-z}$ crystal. Here, x, y, and z is a real number satisfying $0 \leq x \leq 1$, $0 \leq y \leq 1$, $0 \leq z \leq 1$, and also $0 \leq x+y+z \leq 1$. It is desirable that x, y, and z satisfy $0 \leq x \leq 1$ and also $0 < x+y+z \leq 1$. This applies to the ranges of x, y, and z in the following explanation.

For example, the first compound semiconductor 160 is formed by an epitaxial growth method. Chemical Vapor Deposition (occasionally referred to as "CVD"), Metal Organic Chemical Vapor Deposition (occasionally referred to as "MOCVD"), Molecular Beam Epitaxy (occasionally referred to as "MBE"), or Atomic Layer Deposition (occasionally referred to as "ALD") can be used to form the first compound semiconductor 160.

The first compound semiconductor 160 can be annealed. Defects such as lattice defect are occasionally formed inside the first compound semiconductor 160 due to the difference in lattice constant between the base wafer 120 and the first compound semiconductor 160. The defects move inside the first compound semiconductor 160 by heating and annealing the first compound semiconductor 160.

The defects move inside the first compound semiconductor 160, to be eventually caught by a gettering sink or the like at the interface of the first compound semiconductor 160 or inside the first compound semiconductor 160. Therefore, by annealing the first compound semiconductor 160, the crystallinity of the first compound semiconductor 160 improves. The first compound semiconductor 160 can be formed by annealing polycrystal or amorphous $C_xSi_yGe_zSn_{1-x-y-z}$.

The annealing of the first compound semiconductor 160 can be conducted in several steps. For example, high-temperature annealing can be conducted at a temperature not reaching the melting point of first compound semiconductor 160, followed by low-temperature annealing at a temperature lower than the temperature adopted by the high-temperature annealing. This two-step annealing can be repeated a plurality of times. For example, the temperature and duration of the high-temperature annealing is from 850 to 900 degrees centigrade for 2 to 10 minutes, when the first compound semiconductor 160 includes $C_xSi_yGe_zSn_{1-x-y-z}$. The temperature and duration of the low-temperature annealing can be from 650 to 780 degrees centigrade for 2 to 10 minutes.

A first compound semiconductor 160 and an insulator 190 are disposed inside a dummy opening 144-1. The insulator 190 can be disposed after the first compound semiconductor 160 has been grown in the dummy opening 144-1. No electronic element is to be formed on the insulator 190.

There is no first compound semiconductor 160 disposed inside the dummy opening 144-2. For example, the first compound semiconductor 160 is removed by etching or the like, after the growth of the first compound semiconductor 160 within the dummy opening 144-2. No electronic element is formed in the dummy opening 144-2.

The opening 146 has an aspect ratio equal to or greater than $(\sqrt{3})/3$, for example. When a crystal having a predetermined thickness is formed inside the opening 146 having an aspect ratio equal to or greater than $(\sqrt{3})/3$, the defects such as lattice defect included in the crystal are terminated by the wall surface of the opening 146. As a result, the surface of the crystal exposed in the opening 146 has excellent crystallinity when the crystal is formed.

The concept "aspect ratio of the opening" in the present specification is obtained by dividing the depth of the opening by the width of the opening. For example, the "Electronic Information Communication Handbook, Separate Volume 1," Page 751, 1988, edited by The Institute of Electronics, Information and Communication Engineers, published by Ohmsha defines an aspect ratio as an etching depth divided by a pattern width. The term "aspect ratio" is used in the present specification in the same meaning.

The concept "depth of the opening" is the depth in the stacking direction in which thin films are stacked on a wafer, and "width of the opening" is the width in the direction vertical to the stacking direction. When the opening has a plurality of widths, the minimum width is used in calculating the aspect ratio of the opening. For example, when the shape of the opening observed in the stacking direction is rectangular, the length of the short side of the rectangle is used in calculating the aspect ratio.

When the opening has a round shape, a rounded rectangular shape, or an elliptic shape, the diameter or a minor axis corresponds to "width of the opening." The cross sectional shape in the stacking direction of the opening can also be arbitrary. The cross sectional shape can be rectangular, trapezoidal, or parabolic, for example. When the cross sectional shape is trapezoidal, the width of the bottom shape of the opening or the width of the entrance shape of the opening, which is the shortest, corresponds to "width of the opening."

When the shape of the opening observed in the stacking direction is rectangular or square, and the cross sectional shape in the stacking direction is rectangular, the cubic geometry inside the opening is a cuboid. The cubic geometry inside the opening can be arbitrary, not limited to a cuboid. The aspect ratio of the opening having a cubic geometry other than a cuboid can be calculated by approximating the cubic geometry inside the opening to a cuboid.

Figure 3A:
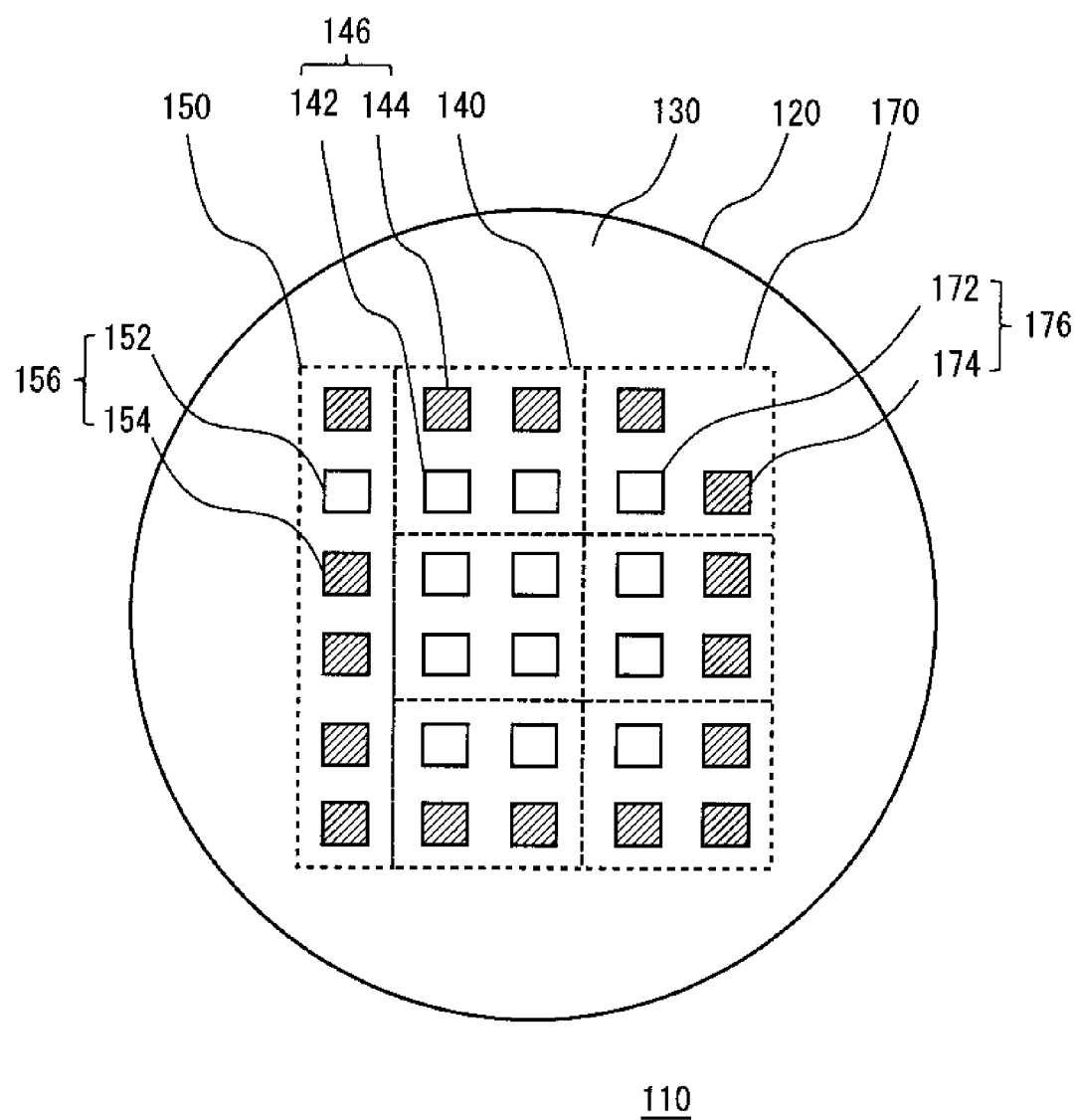
FIG. 3A shows another exemplary plan view of the semiconductor wafer 110.

FIG. 3A shows another exemplary plan view of the semiconductor wafer 110. In this drawing, the inhibition layer 130 further has an opening region 150 and an opening region 170 including openings arranged differently from those in the plurality of opening regions 140. The opening region 150 includes a plurality of openings 156. Some of the plurality of openings 156 are element forming opening(s) 152, in which a compound semiconductor on which an electronic element can be formed is disposed, formed in the same process as the plurality of opening regions 140. The compound semiconductors are formed using the same material and the same production method as in the case of forming the first compound semiconductor 160 in the plurality of openings 146. In the element forming opening 152, a TEG (test element group) device for examining the compound semiconductors formed in the opening regions 140 can be formed.

The other of the plurality of openings 156 are dummy openings 154 in which no electronic element is to be formed. In the element forming opening 152, a compound semiconductor having the same composition as the compound semiconductor disposed in the element forming openings 142 can be disposed. The compound semiconductor having been disposed in the dummy openings 154 can be removed. An insulator can be disposed in the dummy openings 154.

The plurality of openings 156 in the opening region 150 can be used for purposes other than forming an electronic element. For example, some of the plurality of openings 156 are used for such purposes as confirming the shape of a crystal selectively grown inside the openings 146 and the openings 156, or controlling the thickness of the compound semiconductor grown in the openings 146.

The shape of an opening region 170 is the same as the shape of an opening region 140. However, the arrangement of the plurality of openings 176 disposed inside an opening region 170 is different from the arrangement of the plurality of openings 146. Some of the plurality of openings 176 are element forming opening(s) 172 in which a compound semiconductor on which an electronic element is to be formed is disposed. The other of the plurality of openings 176 are dummy openings 174 in which no electronic element is to be formed. In an element forming opening 172, a compound semiconductor having the same composition as the compound semiconductor disposed in the element forming opening 142 can be disposed.

Figure 3B:
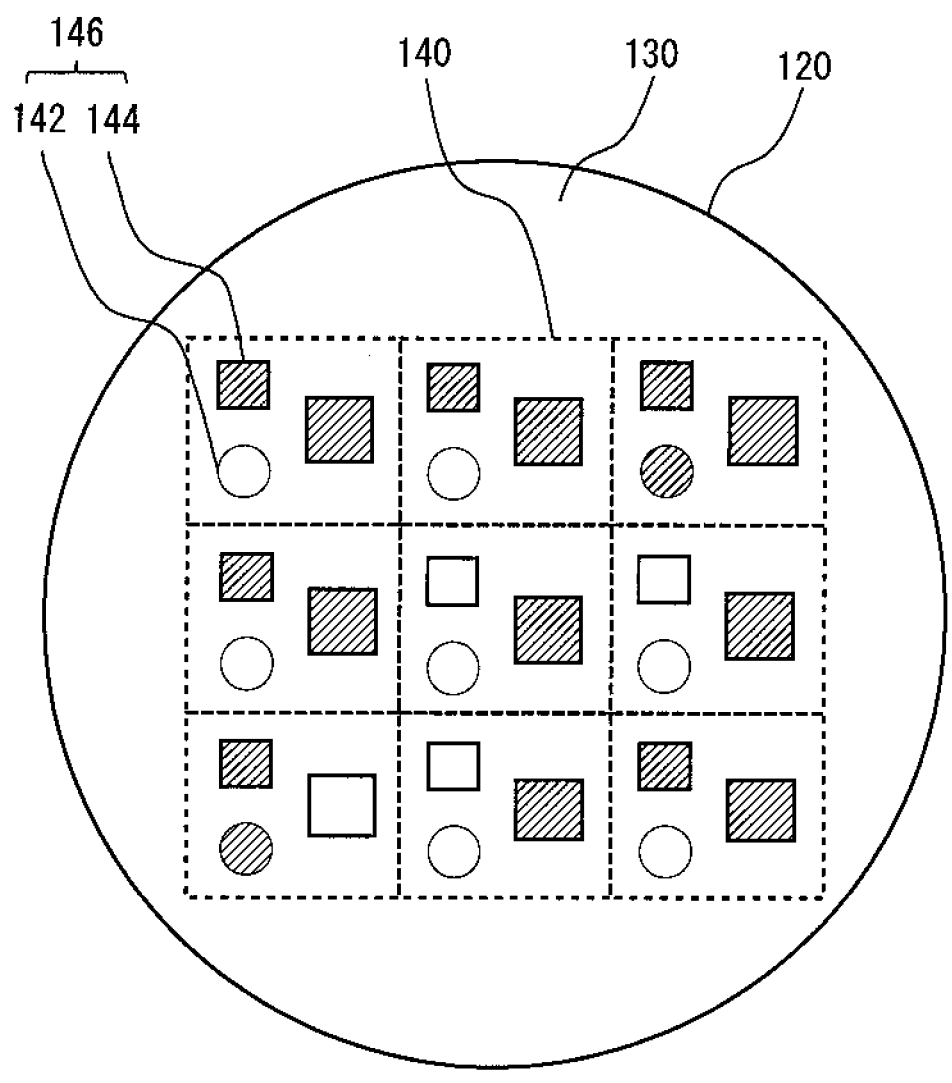
FIG. 3B shows another exemplary plan view of the semiconductor wafer 110.

FIG. 3B shows another exemplary plan view of the semiconductor wafer 110. In this drawing, the plurality of opening regions 140 have a plurality of openings 146 having different shapes or different sizes from each other. The shapes of the plurality of openings 146 can be arbitrary. The shapes can be square, rectangular, circular, oval, and elliptical, for example. According to a configuration in which the plurality of element forming openings 142 in the opening regions 140 have different shapes or different sizes from each other, the compound semiconductor crystals grown in the element forming openings 142 having sizes suited for the specifications of the electronic elements to be formed can be used.

Figure 3C:
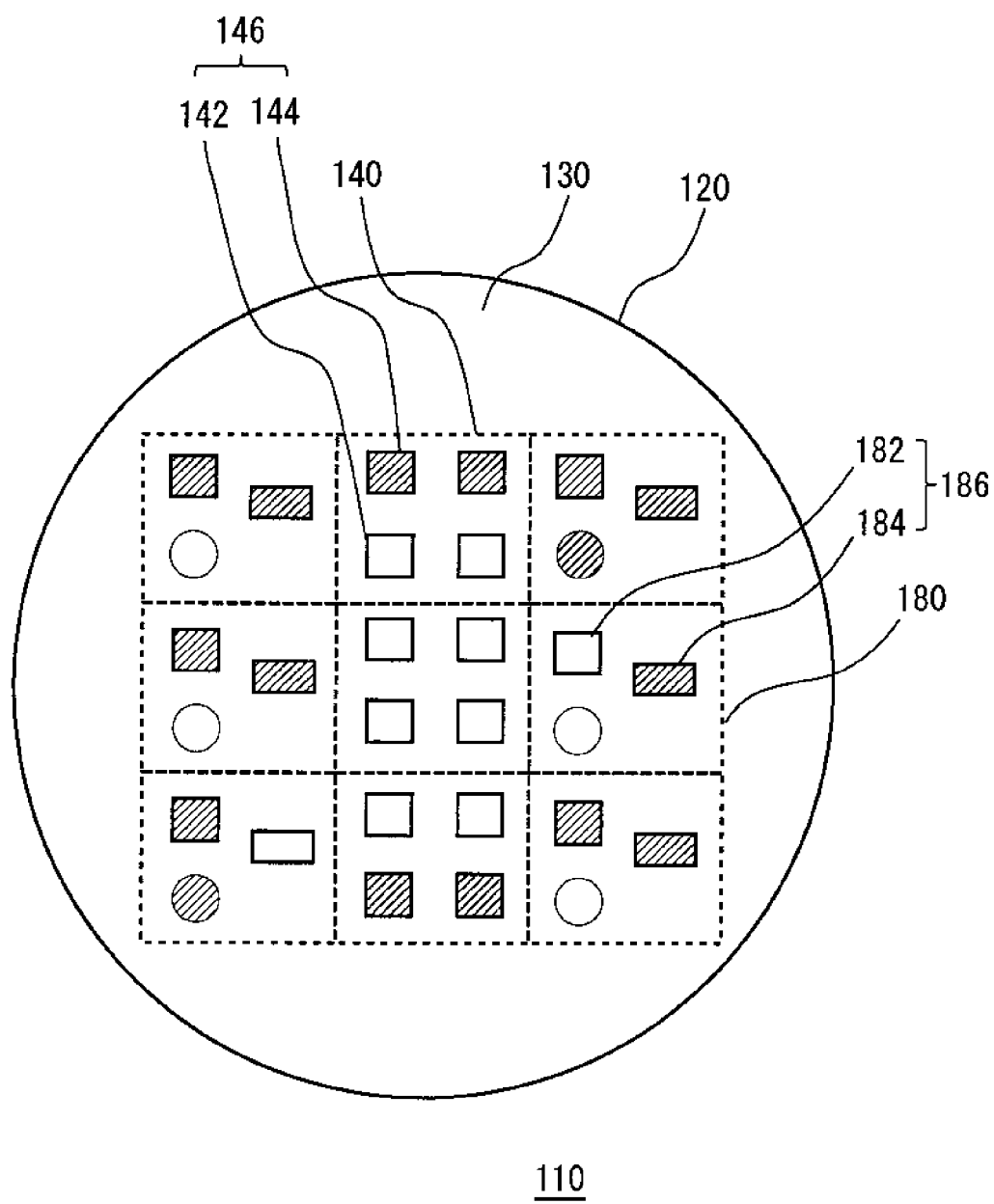
FIG. 3C shows another exemplary plan view of the semiconductor wafer 110.

FIG. 3C shows another exemplary plan view of the semiconductor wafer 110. The semiconductor wafer 110 in this drawing further comprises a plurality of opening regions 180. In each of the plurality of opening regions 180, a plurality of openings 186 are disposed in the same arrangement. Some of the plurality of openings 186 are element forming opening(s) 182 in which a compound semiconductor on which an electronic element is to be formed is disposed. The other the plurality of openings 186 are dummy openings 184 in which no electronic element is to be formed.

In the configuration of FIG. 3C, the semiconductor wafer 110 has a plurality of opening regions having therein a plurality of openings disposed in the same arrangement. When the semiconductor wafer 110 has this configuration, compound semiconductors having a uniform quality and a uniform thickness can be formed in an arrangement that is in accordance with the characteristics required of the electronic elements or the electronic devices to be formed on the semiconductor wafer 110.

Figure 3D:
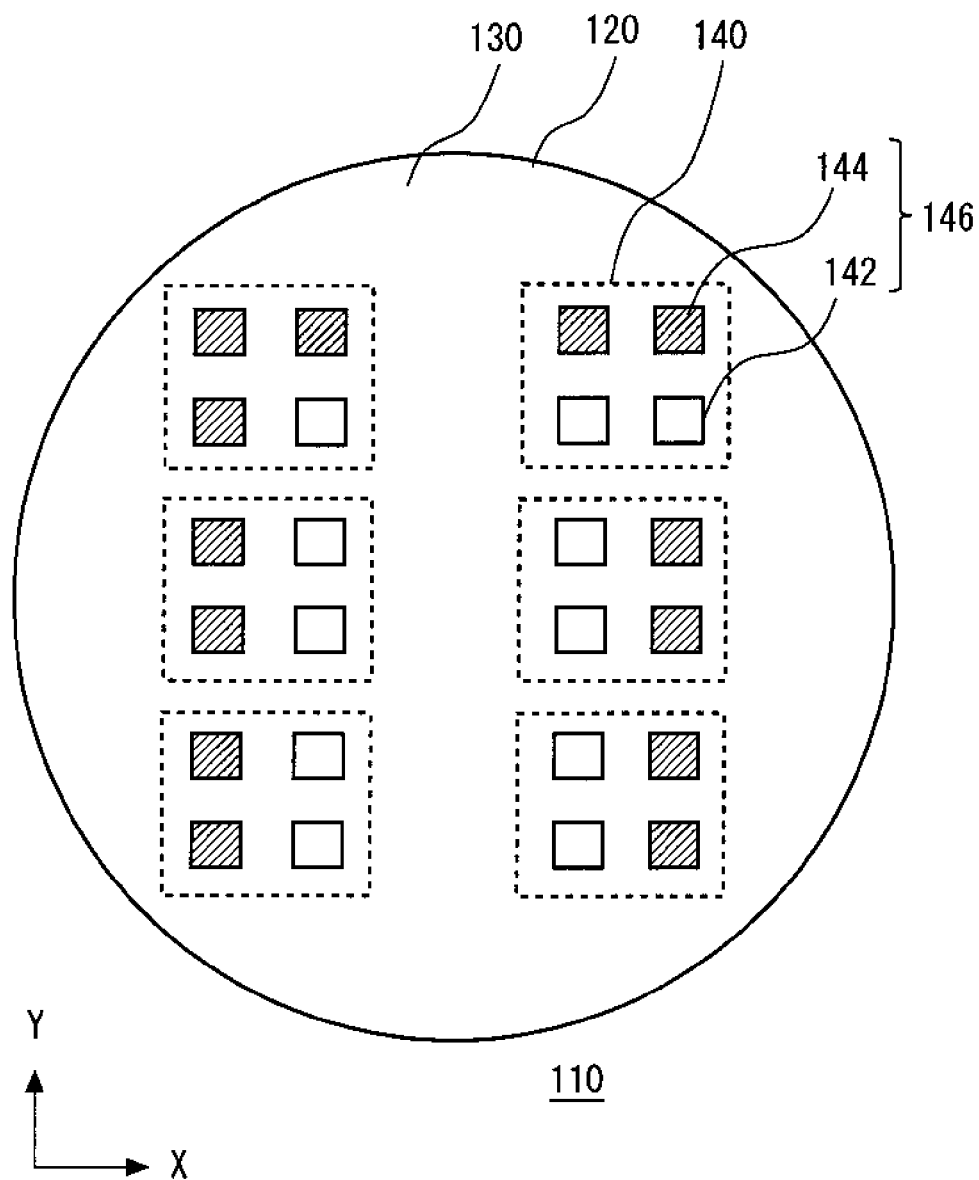
FIG. 3D shows another exemplary plan view of the semiconductor wafer 110.

FIG. 3D shows another exemplary plan view of the semiconductor wafer 110. The plurality of opening regions 140 in this drawing are disposed distant from each other and in a lattice pattern. The plurality of opening regions 140 are arranged at constant intervals both in a first direction (X direction in FIG. 3D) and a second direction (Y direction in FIG. 3D) that is orthogonal to the first direction, but the distance between each opening regions 140 is different in the first direction and in the second direction.

Figure 3E:
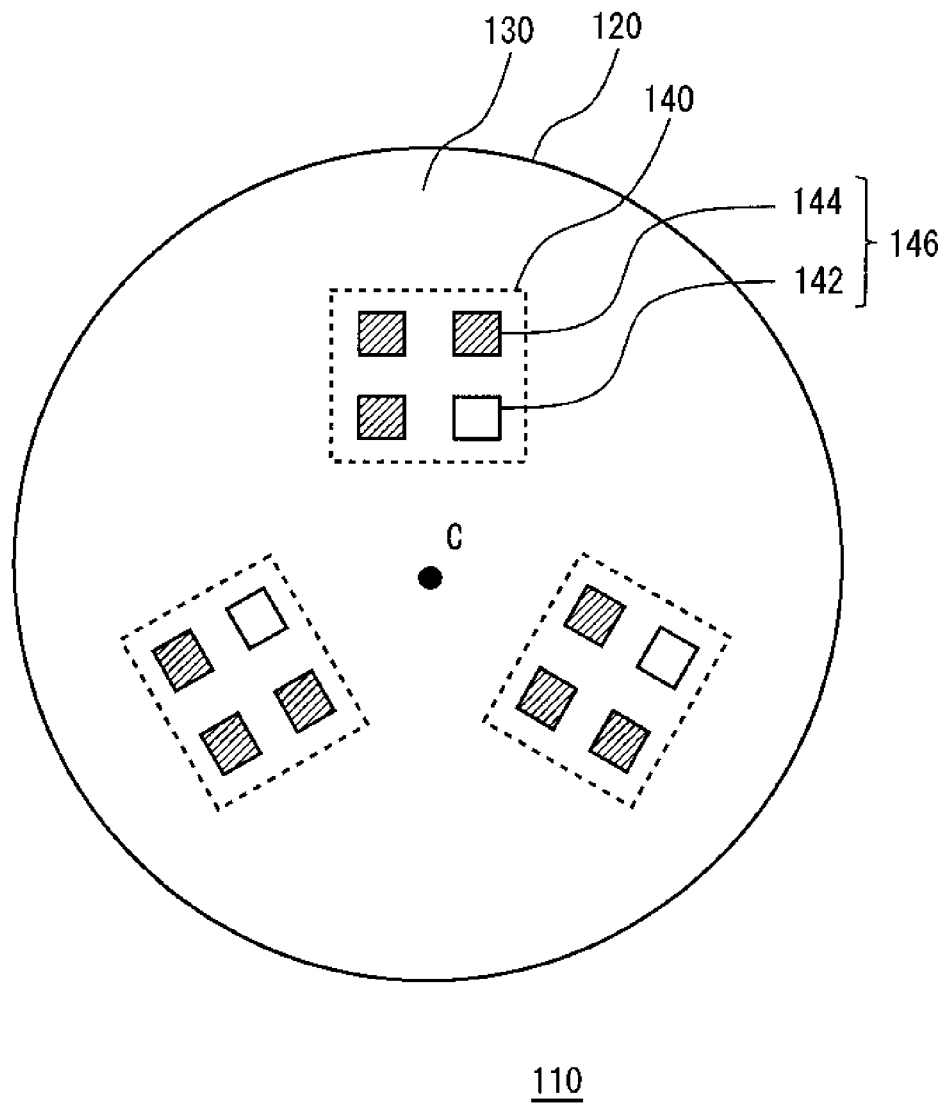
FIG. 3E shows another exemplary plan view of the semiconductor wafer 110.

FIG. 3E shows another exemplary plan view of the semiconductor wafer 110. The plurality of opening regions 140 in this drawing are arranged as if they rotate at the same angle therebetween with the position C on the semiconductor wafer 110 as a center. In this way, the plurality of opening regions 140 can be arranged according to a periodic alignment pattern having a rotation symmetry. In other words, the plurality of opening regions 140 can be arranged at a predetermined rotation angle on the circumference of a circle whose center is the reference position on the base wafer 120.

For example, when the first compound semiconductors 160 disposed in the plurality of openings 146 have a crystal structure, the plurality of opening regions 140 are arranged to have a rotation angle therebetween such as 180 degrees, 120 degrees, 90 degrees, or 60 degrees. When the first compound semiconductors 160 disposed in the plurality of openings 146 have a paracrystal structure, the plurality of opening regions 140 are arranged to have a rotation angle therebetween such as 72 degrees, 45 degrees, 36 degrees, or 30 degrees. The plurality of opening regions 140 can be arranged as a penrose tiling, combining rhombuses of an acute angle of 72 degrees and an obtuse angle of 108 degrees with rhombuses of an acute angle of 36 degrees and an obtuse angle of 144 degrees.

Figure 3F:
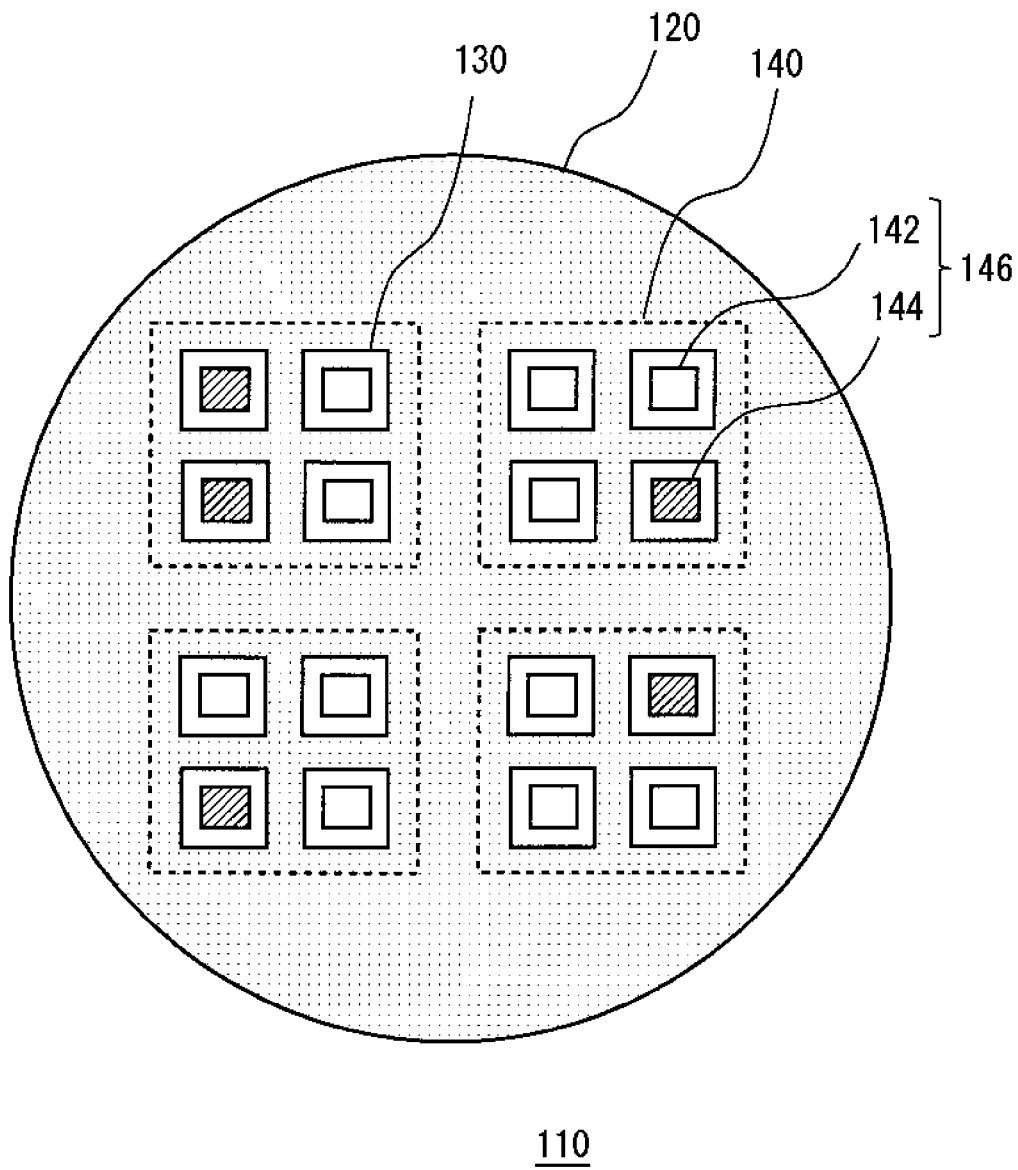
FIG. 3F shows another exemplary plan view of the semiconductor wafer 110.

FIG. 3F shows another exemplary plan view of the semiconductor wafer 110. In this drawing, the inhibition layer 130 is separated into a plurality of regions on the base wafer 120. In each of the separated regions, a single opening 146 has been formed. The base wafer 120 comprises a plurality of opening regions 140 including a plurality of separate regions.

In other regions than the separated regions in respective opening regions 140, the base wafer 120 is exposed. An electronic element can be disposed in the region in which the base wafer 120 is exposed. For example, the region in which the base wafer 120 is exposed is used as a TEG device region in which a test element for testing the electronic element disposed on the first compound semiconductor 160 within the element forming opening 142.

Figure 3G:
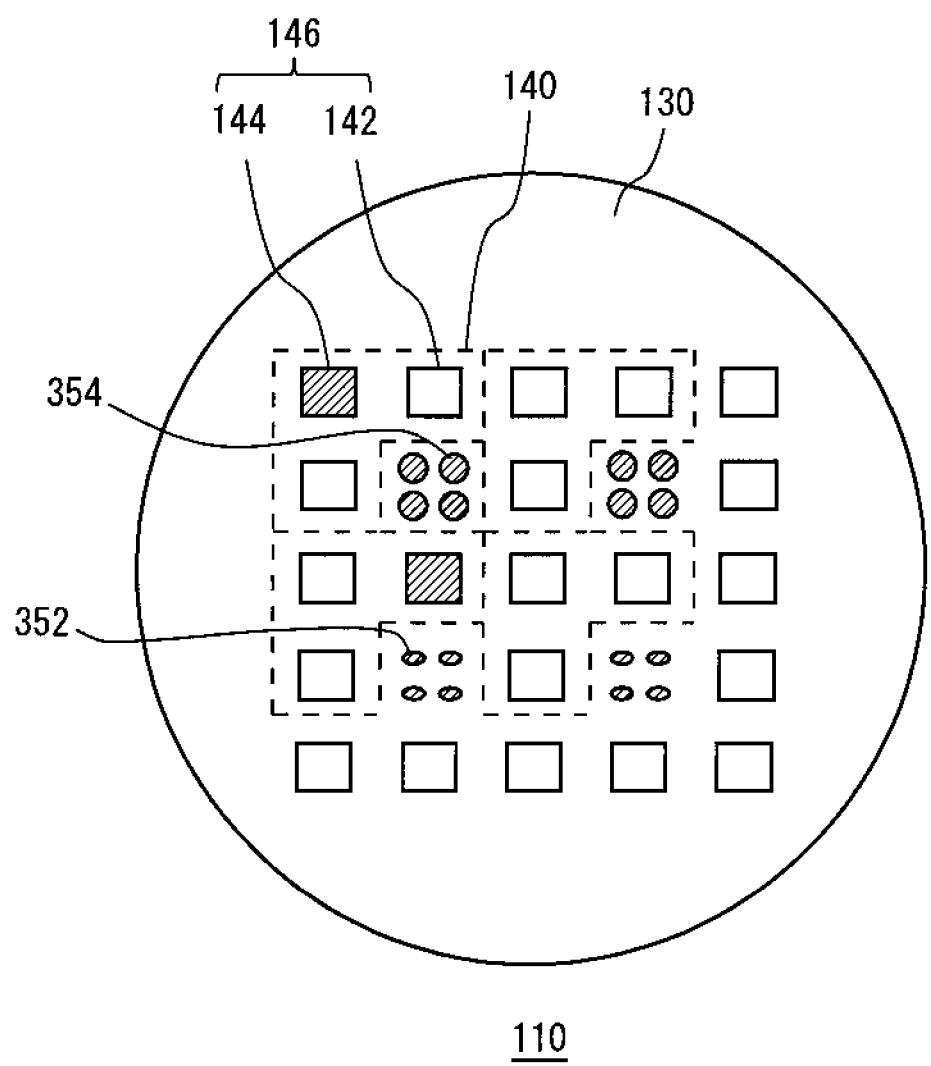
FIG. 3G shows another exemplary plan view of the semiconductor wafer 110.

FIG. 3G shows another exemplary plan view of the semiconductor wafer 110. The plurality of opening regions 140 in the semiconductor wafer 110 have a polygonal shape other than a quadrate shape. In the region other than the opening regions 140, an opening 352 and an opening 354 having different shapes from the shape of the openings 146 included in the opening regions 140 are disposed. In the opening 352 and 354, a test element for testing the electronic element formed in the openings 146 in the opening regions 140 can be formed.

Figure 4:
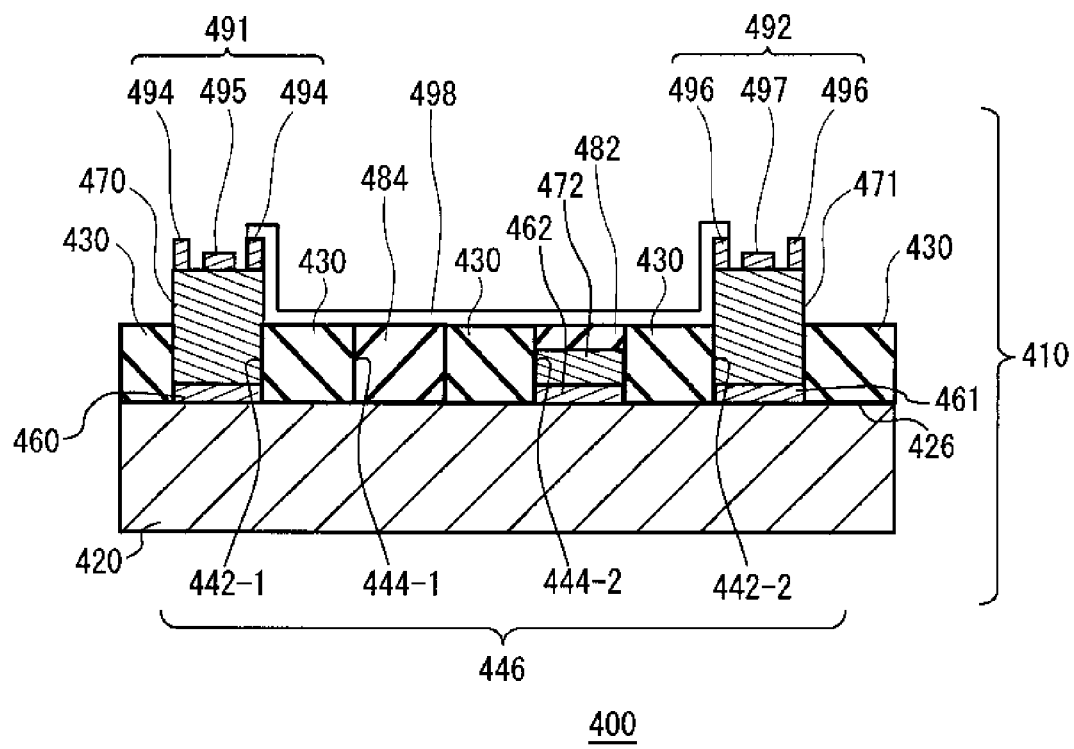
FIG. 4 schematically shows an exemplary cross sectional view of an electronic device 400.

FIG. 4 schematically shows an exemplary cross sectional view of an electronic device 400. The electronic device 400 includes a semiconductor wafer 410, an electronic element 491, an electronic element 492, and an interconnection 498.

The semiconductor wafer 410 has a base wafer 420 and an inhibition layer 430. The base wafer 420 has the same configuration as the base wafer 120. The base wafer 420 is a wafer having Si crystals, such as a Si wafer or an SOI wafer. The inhibition layer 430 has the same configuration as the inhibition layer 130.

The inhibition layer 430 is disposed on a main plane 426 of the base wafer 420. The inhibition layer 430 has a plurality of openings 446. Some of the plurality of openings 446 are two element forming openings 442 (442-1, 442-2), and the other part of the plurality of openings 446 are two dummy openings 444 (444-1, 444-2) adjacent to the element forming openings 442.

The element forming openings 442 are openings in which the first compound semiconductor 470 or the first compound semiconductor 471 on which an electronic element is formed is to be formed is formed. The dummy openings 444 are openings in which no electronic element is to be formed.

When there is an excess supply of precursors which is a source of epitaxial growth, the dummy openings 444 function as a means for controlling the amount of precursor supply to the element forming openings 442. When the semiconductor wafer 410 has the dummy openings 444, during the epitaxial growth of the first compound semiconductor 470 and the first compound semiconductor 471, a part of the precursors of the first compound semiconductor 470 and the first compound semiconductor 471 is supplied to the dummy openings 444 not only to the element forming openings 442. As a result, the excess supply of precursors to the element forming openings 442 is restrained.

Accordingly, a first seed crystal 460, a first seed crystal 461, a first compound semiconductor 470, and a first compound semiconductor 471 are stably grown inside the element forming openings 442. Since the growth in the element forming openings 442 is stabilized in this way, setting of the process condition in production of the semiconductor wafer 410 becomes easy compared to a case where no dummy opening is provided in addition to the element forming openings 442. In addition, it becomes easier to control the quality and the thickness of the first compound semiconductor 470 grown on the semiconductor wafer 410.

The element forming openings 442 and the dummy openings 444 are included in the same opening region. The semiconductor wafer 410 can include element forming openings 442 and dummy openings 444 in different number and arrangement from the number and arrangement shown in FIG. 4.

Inside the element forming opening 442-1, the base wafer 420, the first seed crystal 460, and the first compound semiconductor wafer 470 are arranged in this order in a direction substantially vertical to the main plane 426. Inside the element forming opening 442-2, the base wafer 420, the first seed crystal 461, and the first compound semiconductor 471 are arranged in this order in a direction substantially vertical to the main plane 426.

The semiconductor wafer 410 has, inside the dummy opening 444-2, a seed crystal 462, a second compound semiconductor 472, and an insulator 482. Inside the dummy opening 444-2, the base wafer 420, the seed crystal 462, the second compound semiconductor 472, and the insulator 482 are arranged in this order in a direction substantially vertical to the main plane 426. The semiconductor wafer 410 has an insulator 484 inside the other dummy opening 444-1. The insulator 484 is in contact with the base wafer 420. A third compound semiconductor smaller in thickness than the first compound semiconductor 470 can be disposed inside the dummy opening 444-1. The insulator 484 can be disposed on this third compound semiconductor.

The first seed crystal 460 and the first seed crystal 461 provide a favorable seed plane to the first compound semiconductor 470 and the first compound semiconductor 471. The first seed crystal 460 and the first seed crystal 461 restrain the impurities existing in the base wafer 420 or the main plane 426 from adversely affecting the crystallinity of the first compound semiconductor 470 and the first compound semiconductor 471. The first seed crystal 460 and the first seed crystal 461 can be formed in the same process and have the similar configuration to each other. The first seed crystal 461 is not explained in the following explanation.

The first seed crystal 460 is in contact with the main plane 426 of the base wafer 420. The first seed crystal 460 is a layer that includes a semiconductor crystal. The first seed crystal 460 includes a plurality of layers, for example. The first seed crystal 460 can include $C_xSi_yGe_zSn_{1-x-y-z}$. When the base wafer 420 is a wafer having Si crystals such as a Si wafer or an SOI wafer, and the first compound semiconductor is a Group 3-5 compound semiconductor such as GaAs and GaAlAs, the first seed crystal 460 can preferably be a $C_xSi_yGe_zSn_{1-x-y-z}$ crystal, more preferably $Si_yGe_z$ (0≤y≤0.1, 0.9≤z≤1, and also y+z=1), and even more preferably Ge crystals.

For example, the first seed crystal 460 can be selectively grown by an epitaxial growth method. For example, the first seed crystal 460 can be formed by Chemical Vapor Deposition, Metal Organic Chemical Vapor Deposition, Molecular Beam Epitaxy, or Atomic Layer Deposition. The first seed crystal 460 can be formed on a part of the base wafer 420, by forming a seed crystal layer using the epitaxial growth method or the like, and subsequently patterning it by etching, photolithography, or the like.

The first seed crystal 460 can be annealed. Defects such as lattice defect are occasionally generated inside the first seed crystal 460 due to the difference in lattice constant between the base wafer 420 and the first seed crystal 460, for example. The defects move inside the first seed crystal 460 by heating and annealing the first seed crystal 460, to be eventually caught a gettering sink at the interface of the first seed crystal 460 or inside the first seed crystal 460. Accordingly, the crystallinity of the first seed crystal 460 improves. The first seed crystal 460 can be formed by annealing amorphous or polycrystal $C_xSi_yGe_zSn_{1-x-y-z}$.

The seed crystal 462 can be formed in the same process as the first seed crystal 460. The seed crystal 462 has a similar configuration to that of the first seed crystal 460 and the first seed crystal 461, except that the seed crystal 462 is formed inside the dummy opening 444.

The first compound semiconductor 470 lattice-matches or pseudo lattice-matches the first seed crystal 460. The first compound semiconductor 470 has a similar configuration to that of the first compound semiconductor 160. The first compound semiconductor 470 is in contact with the first seed crystal 460. The first compound semiconductor 470 is a Group 3-5 compound semiconductor such as GaAs. The first compound semiconductor 470 includes $C_xSi_yGe_zSn_{1-x-y-z}$, for example. The first compound semiconductor 470 can include a plurality of layers. The interface between the first compound semiconductor 470 and the first seed crystal 460 exists inside the element forming opening 442. The first compound semiconductor 470 is formed by an epitaxial growth method such as MOCVD.

In the present specification, "pseudo lattice-match" is used to describe a phenomenon where the difference in lattice constant between two semiconductors in contact with each other is small although not a complete lattice-match, and so the occurrence of defects due to the lattice mismatch is not noticeable and the two semiconductors can still be stacked. When the semiconductors "pseudo lattice-match," the crystal lattices of the semiconductors deform within the elastically deformable range, thereby absorbing the difference in lattice constant. For example, when Ge and GaAs are stacked, they "pseudo lattice-match."

The first compound semiconductor 471 is formed in the same process as the first compound semiconductor 470. The first compound semiconductor 471 has a similar configuration to that of the first compound semiconductor 470. The second compound semiconductor 472 is formed in the same process as the first compound semiconductor 470. The second compound semiconductor 472 has a similar configuration to that of the first compound semiconductor 470 and the first compound semiconductor 471, except that the second compound semiconductor 472 lattice-matches or pseudo lattice-matches the seed crystal 462.

The insulator 482 insulates the second compound semiconductor 472 from the interconnection 498. The insulator 482 is silicon oxide, silicon nitride, aluminum oxide, and other insulating oxide or insulating nitride for example. The insulator 482 can also be a mixture of the insulating oxide and the insulating nitride or a film made by stacking them. Another example of the insulator 482 is an amorphous material such as glass, heat-resistant organics, heat-resistant polymer. For example, the insulator 482 is formed by forming a thin film by thermal CVD, plasma CVD, sputtering, or a coating method, and thereafter patterning the thin film.

The insulator 484 insulates the base wafer 420 from the interconnection 498. The insulator 484 includes a material similar to the material of the insulator 482, for example. The insulator 484 can be formed in the same process as the insulator 482. For example, the insulator 484 is formed inside the dummy opening 444 after removing at least a part of the compound semiconductor formed in the dummy opening 444 in the same process as the first compound semiconductor.

The electronic element 491 is formed on the first compound semiconductor 470. The electronic element 491 uses the first compound semiconductor 470 as a channel layer. The electronic element 491 is an HBT for example. The electronic element 491 has a pair of input/output electrodes 494 and a control electrode 495. A voltage is applied to the control electrode 495 to control the current between the pair of input/output electrodes 494.

The electronic element 491 is not limited to an HBT. The electronic element 491 can be any of an amplifying element, a switching element, an integrated circuitry element constituting an integrated circuit, a light emitting element converting electricity into light, and a light receiving element outputting a voltage or a current according to received light. Some examples of the amplifying element and the switching element are FET and HBT. An example of the integrated circuit is a digital IC. An example of the light emitting element is a light emitting device having pn junction, and an example of the light receiving element is a light receiving device including pn junction or Schottky junction.

Other examples of the electronic element 491 include an active element such as semiconductor devices such as MOSFET (metal-oxide-semiconductor field-effect transistor), MISFET (metal-insulator-semiconductor field-effect transistor), and HEMT (high electron mobility transistor), a light emitting device such as a semiconductor laser, a light emitting diode, and a light emitting thyristor, a light receiving device such as a photo sensor and a photo diode, and a solar cell.

Other examples of the electronic element 491 include a passive element such as a resistor, a capacitor, and an inductor.

The electronic element 492 is formed on the first compound semiconductor 471. For example, the electronic element 492 is an HBT using the first compound semiconductor 471 as a channel layer. The electronic element 492 has a pair of input/output electrodes 496 and a control electrode 497. A voltage is applied to the control electrode 497 to control the current between the pair of input/output electrodes 496. Just as the electronic element 491, the electronic element 492 can be an element other than an HBT. For example, the electronic element 492 is electrically coupled to the electronic element 491. One of the input/output electrodes 494 of the electronic element 491 is connected to one of the input/output electrodes 496 of the electronic element 492 via the interconnection 498.

The following explains a method of producing the electronic device 400, with reference to FIG. 5 through FIG. 10. The method of producing the semiconductor wafer 410 is also explained.

Figure 5:
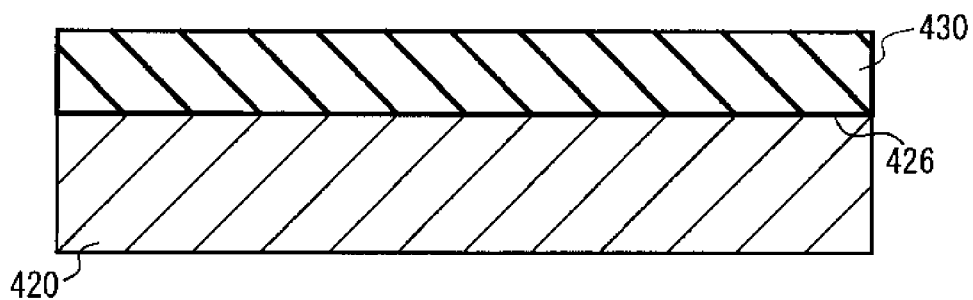
FIG. 5 schematically shows an exemplary production process of the electronic device 400.

FIG. 5 schematically shows an exemplary production process of the electronic device 400. As shown in FIG. 5, the base wafer 420 is prepared first. The base wafer 420 is a Si wafer or an SOI wafer having a Si crystal layer. Next, an inhibition layer 430 is formed on the main plane 426 of the base wafer 420. In the step of forming the inhibition layer 430, silicon oxide is formed by CVD for example.

Figure 6:
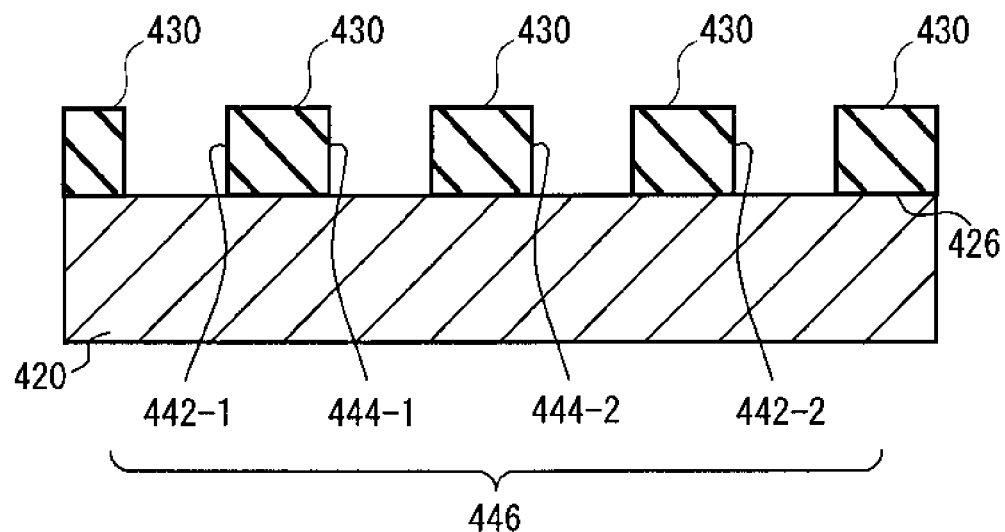
FIG. 6 schematically shows an exemplary production process of the electronic device 400.

FIG. 6 schematically shows an exemplary production process of the electronic device 400. As shown in FIG. 6, the inhibition layer 430 is provided with an opening 446 penetrating the inhibition layer 430 in a direction substantially vertical to the main plane 426 of the base wafer 420. For example, the opening 446 is formed by photolithography such as etching. A plurality of openings 446 are provided through the inhibition layer 430 to expose the main plane 426 of the base wafer 420. In the step of forming the plurality of openings 446, some of the openings 446 can be provided in a regular arrangement. In the present embodiment, the element forming opening 442-1, the element forming opening 442-2, the dummy opening 444-1, and the dummy opening 444-2 are formed at constant intervals.

Figure 7:
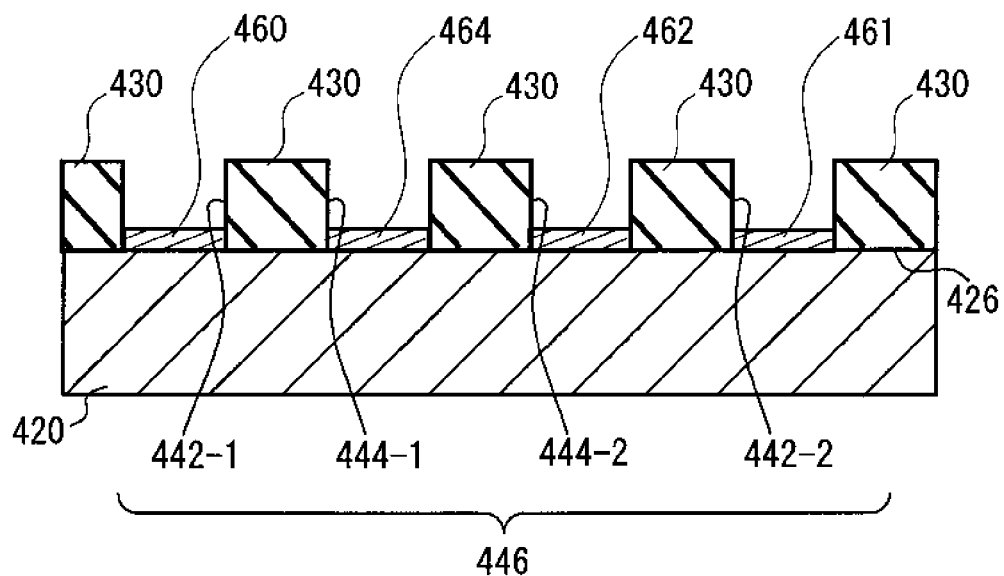
FIG. 7 schematically shows an exemplary production process of the electronic device 400.

FIG. 7 schematically shows an exemplary production process of the electronic device 400. As shown in FIG. 7, the first seed crystal 460 and the first seed crystal 461 are respectively disposed inside the element forming opening 442-1 and the element forming opening 442-2. The first seed crystal 460 and the first seed crystal 461 can be in contact with the Si crystal layer included in the Si wafer or the SOI wafer. The first seed crystal 460 and the first seed crystal 461 is disposed inside the element forming opening 442-2 by growth of the $C_xSi_yGe_zSn_{1-x-y-z}$ using CVD.

In the step of disposing the first seed crystal 460 and the first seed crystal 461, the seed crystal 462 and the seed crystal 464 are respectively disposed inside the dummy opening 444-2 and the dummy opening 444-1. The seed crystal 462 and the seed crystal 464 are made of the same material as the first seed crystal 460 and the first seed crystal 461.

After the first seed crystal 460, the first seed crystal 461, the seed crystal 462, and the seed crystal 464 have been disposed, the first seed crystal 460, the first seed crystal 461, the seed crystal 462, and the seed crystal 464 can be annealed. The annealing can be performed during growth of the crystal. Note that the first seed crystal 460, the first seed crystal 461, the seed crystal 462, and the seed crystal 464 can be disposed only in some of the plurality of element forming openings 442 and the plurality of dummy openings 444.

Figure 8:
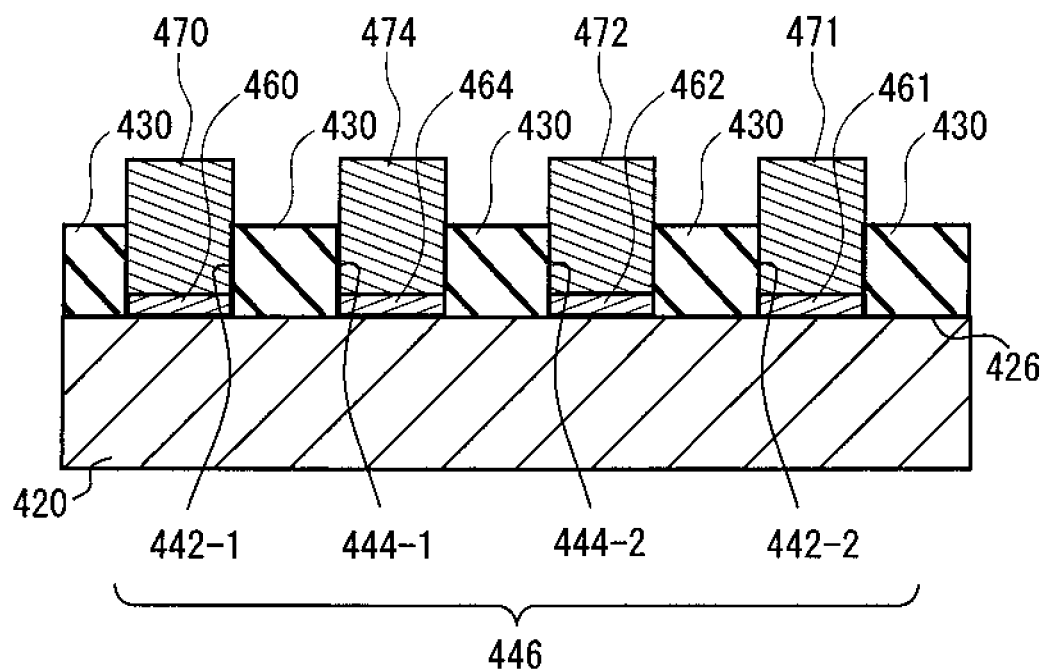
FIG. 8 schematically shows an exemplary production process of the electronic device 400.

FIG. 8 schematically shows an exemplary production process of the electronic device 400. As shown in FIG. 8, the first compound semiconductor 470 and the first compound semiconductor 471 are respectively grown inside the element forming opening 442-1 and the element forming opening 442-2. For example, the first compound semiconductor 470 and the first compound semiconductor 471 are obtained by growing GaAs using MOCVD. The first compound semiconductor 470 and the first compound semiconductor 471 can be grown to protrude from the surface of the inhibition layer 430.

In the step of growing the first compound semiconductor 470 and the first compound semiconductor 471, the second compound semiconductor 472 and the third compound semiconductor 474 are grown inside the dummy opening 444-2 and the dummy opening 444-1. The second compound semiconductor 472 and the third compound semiconductor 474 can include the same material as the first compound semiconductor 470, and are grown in the similar method to that of the first compound semiconductor 470. Note that the first compound semiconductor 470, the first compound semiconductor 471, the second compound semiconductor 472, and the third compound semiconductor 474 can be disposed only in some of the plurality of element forming openings 442 and the plurality of dummy openings 444.

Figure 9:
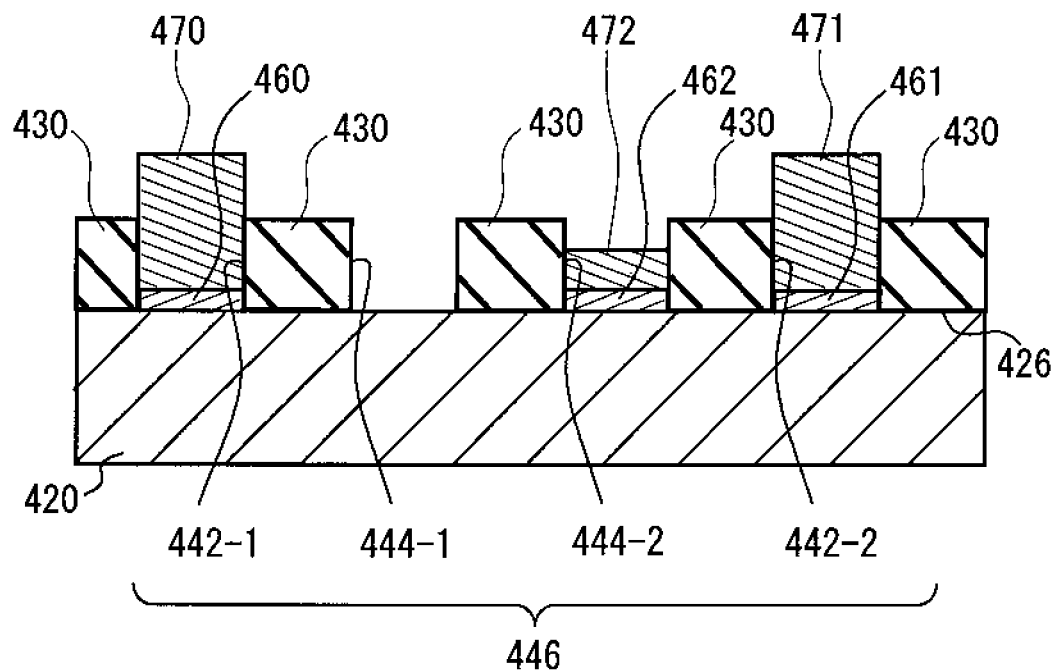
FIG. 9 schematically shows an exemplary production process of the electronic device 400.

FIG. 9 schematically shows an exemplary production process of the electronic device 400. As shown in FIG. 9, at least a part of the second compound semiconductor 472 inside the dummy opening 444-2 is removed. For example, at least a part of the second compound semiconductor 472 is removed to be concave with respect to the surface of the inhibition layer 430. In addition, the third compound semiconductor 474 and the seed crystal 464 inside the dummy opening 444-1 are removed. During this operation, the first compound semiconductor 470 and the first compound semiconductor 471 are not removed.

The second compound semiconductor 472, the third compound semiconductor 474, and the seed crystal 464 are removed by etching for example. During this operation, the first compound semiconductor 470 and the first compound semiconductor 471 are protected by resist. The second compound semiconductor 472, the third compound semiconductor 474, and the seed crystal 464 are removed together with the part of the inhibition layer 430. Note that at least a part of the seed crystal 462 can also be removed.

When producing the electronic device 400, it is not necessary to remove the second compound semiconductor 472. For example when the second compound semiconductor 472 is not formed to protrude from the surface of the inhibition layer 430, the second compound semiconductor 472 may not be removed.

Figure 10:
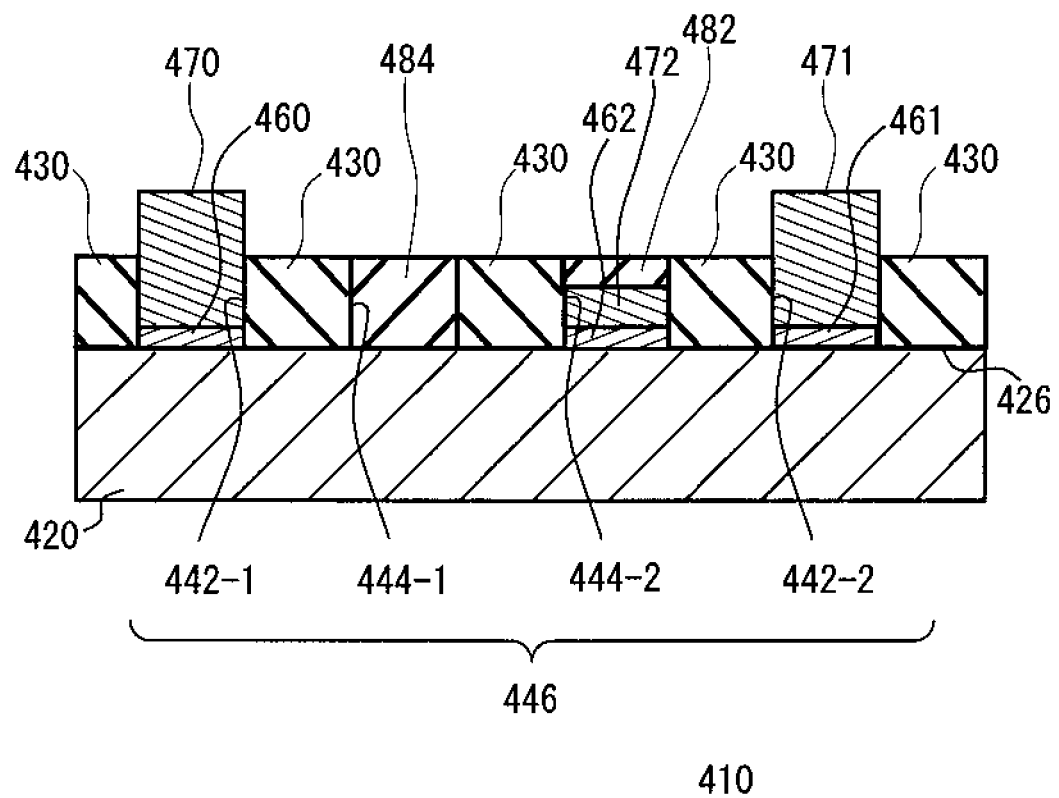
FIG. 10 schematically shows an exemplary production process of the electronic device 400.

FIG. 10 schematically shows an exemplary production process of the electronic device 400. As shown in FIG. 10, the insulator 482 is formed in the dummy opening 444-2. The insulator 482 is formed to cover the second compound semiconductor 472 or the seed crystal 462. The insulator 484 is formed inside the dummy opening 444-1 from which the third compound semiconductor 474 has been removed. The insulator 484 can be disposed on the third compound semiconductor 474 having been removed to have a thickness smaller than the thickness of the first compound semiconductor 470. The insulator 482 and the insulator 484 are silicon oxide formed by CVD for example.

Next, the electronic element 491 is formed by forming the pair of input/output electrodes 494 and the control electrode 495 on the first compound semiconductor 470. For example, the input/output electrodes 494 and the control electrode 495 are obtained by forming a thin film by a conductive material such as titanium (Ti) or gold (Au), and patterning the thin film by photolithography or the like.

Likewise, the electronic element 492 is formed by forming the pair of input/output electrodes 496 and a control electrode 497 on the first compound semiconductor 470. Furthermore, the interconnection 498 connecting one of the input/output electrodes 494 with one of the input/output electrodes 496 is formed, thereby obtaining the electronic device 400. For example, the interconnection 498 is obtained by forming a tin film by a conductive material such as Ti or Au by vacuum evaporation, and patterning the thin film by photolithography or the like.

Figure 11A:
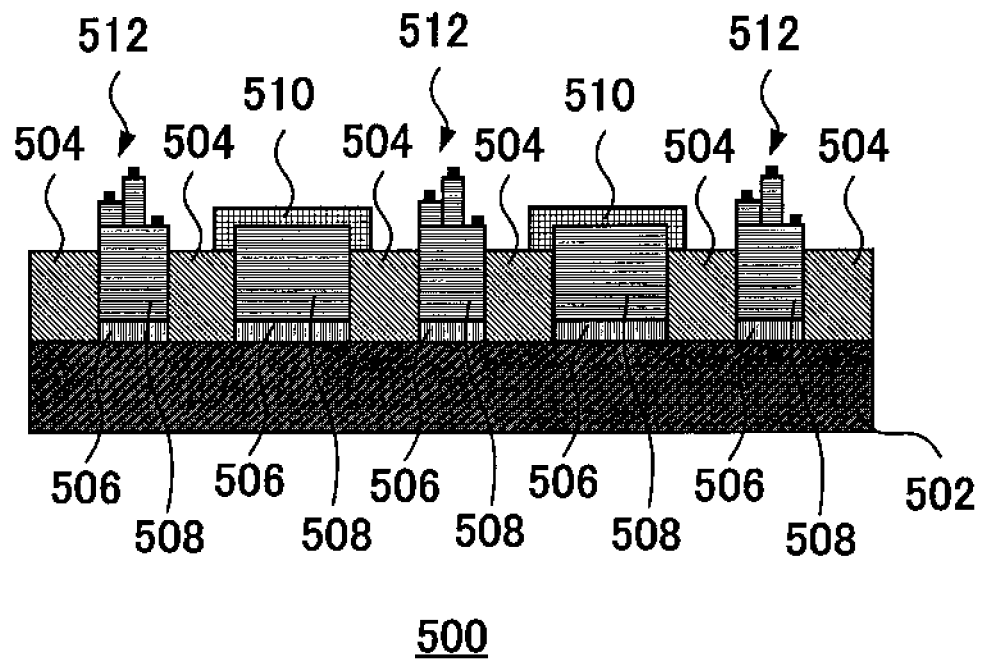
FIG. 11A shows an exemplary cross sectional view of an electronic device 500.

FIG. 11A shows an exemplary cross sectional view of an electronic device 500. The electronic device 500 has a base wafer 502, an inhibition layer 504, a seed crystal 506, a compound semiconductor 508, an insulator 510, and an electronic element 512. The inhibition layer 504 is formed on the base wafer 502. As in the drawing, the seed crystal 506 is formed on the base wafer 502 not covered with the inhibition layer 504. The compound semiconductor 508 is formed on the seed crystal 506 to be in contact with the seed crystal 506.

Figure 11B:
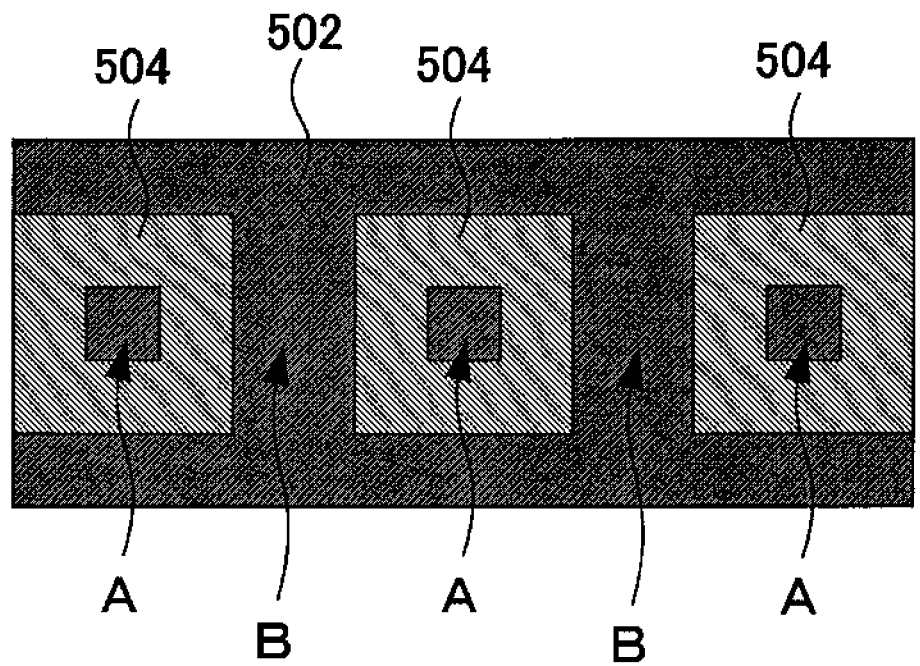
FIG. 11B shows a plan view pattern of an inhibition layer 504 of the electronic device 500.

FIG. 11B shows a plan view pattern of an inhibition layer 504 of the electronic device 500. Each inhibition layer 504 is formed to be isolated from one another on the base wafer 502, and each inhibition layer 504 is provided with an opening A. Although an example in which each inhibition layer 504 has one opening A is shown, each inhibition layer 504 can be provided with a plurality of openings A. Because each inhibition layer 504 is isolated from one another, a groove B is formed between each neighboring inhibition layers 504. The seed crystal 506 is formed on the bottom of the opening A as well as on the bottom of the groove B. The electronic element 512 is formed on the compound semiconductor 508 formed on the seed crystal 506 in the opening A, and the insulator 510 covers the compound semiconductor 508 formed on the seed crystal 506 in the groove B.

Figure 12A:
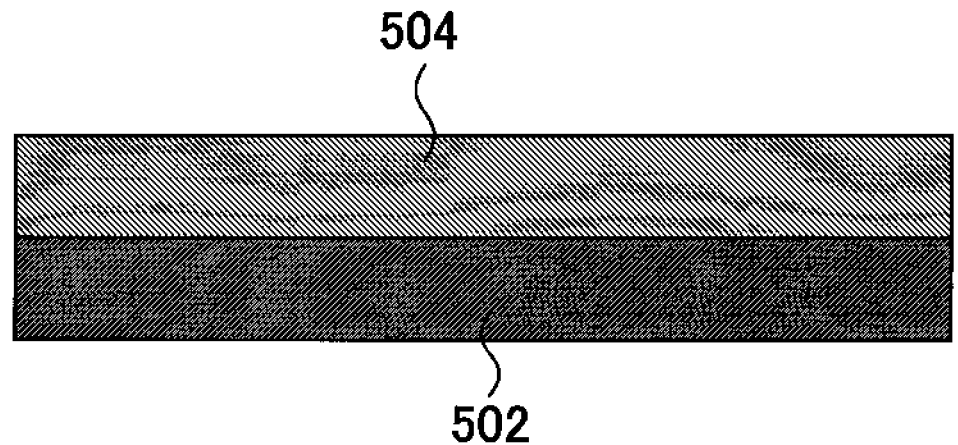
FIG. 12A is a cross sectional view of an exemplary method of producing the electronic device 500.

FIG. 12A to FIG. 12D are cross sectional view showing an exemplary method of producing electronic device 500, step by step. As shown in FIG. 12A, a base wafer 502 having an inhibition layer 504 is prepared. An example of the base wafer 502 is a Si wafer or an SOI wafer whose surface is made of silicon crystals. The inhibition layer 504 is formed on the base wafer 502. As the inhibition layer 504, silicon oxide is formed by CVD for example.

Figure 12B:
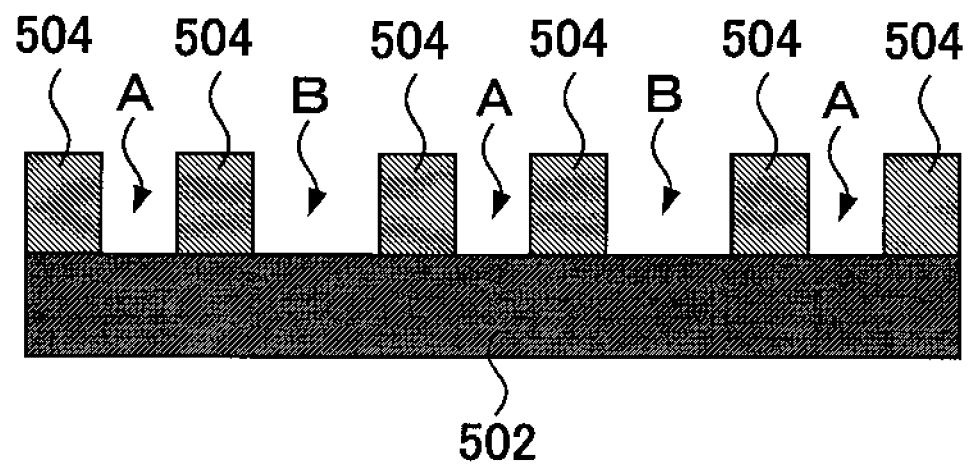
FIG. 12B is a cross sectional view of an exemplary method of producing the electronic device 500.

The inhibition layer 504 is processed as shown in FIG. 12B. A plurality of inhibition layers 504 are formed along the upper plane of the base wafer 502 with intervals therebetween. A groove B is formed between each neighboring inhibition layers 504. An opening A is provided through each inhibition layer 504 formed to be distant from one another, to penetrate to the base wafer 502. In processing the inhibition layer 504, photolithography such as etching can be used. The inhibition layers 504 distant from each other are preferably formed regularly. The inhibition layers 504 distant from each other can be provided with one or more openings.

In the present embodiment, three isolated inhibition layers 504 are formed at constant intervals therebetween, and three openings A are formed at constant intervals therebetween, so that each inhibition layer 504 has one opening A. Both of the openings A, and the grooves B between neighboring inhibition layers 504 expose the upper plane of the base wafer 502.

Figure 12C:
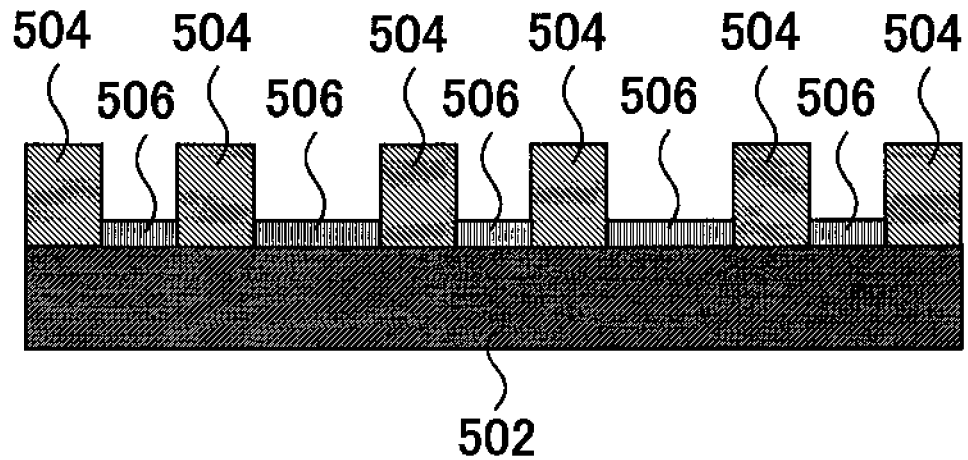
FIG. 12C is a cross sectional view of an exemplary method of producing the electronic device 500.

As shown in FIG. 12C, the seed crystal 506 is formed inside the openings A and inside the grooves B. The seed crystal 506 is preferably in contact with the silicon crystal layer included in a wafer whose surface is made of silicon or an SOI wafer. An example of the seed crystal 506 is a $C_xSi_yGe_zSn_{1-x-y-z}$ crystal formed by CVD. After formation of the seed crystal 506, the seed crystal 506 is preferably annealed. The annealing can be performed during growth of the seed crystal 506. The present embodiment is a case where the seed crystal 506 is formed in all the openings A and in all the grooves B. However, the present invention is not limited to such a configuration. For example, the seed crystal 506 can be formed in some of the plurality of openings A.

Figure 12D:
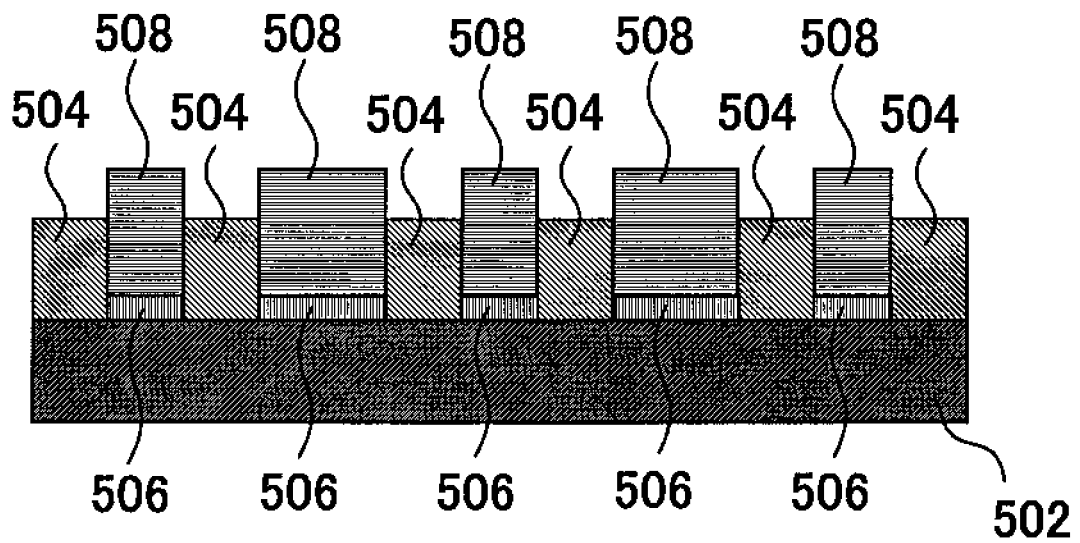
FIG. 12D is a cross sectional view of an exemplary method of producing the electronic device 500.

As shown in FIG. 12D, the compound semiconductor 508 is formed inside the openings A and inside the grooves B. An example of the compound semiconductor 508 is GaAs formed by MOCVD. It is preferable that the compound semiconductor 508 be formed to protrude from the surface of the inhibition layer 504. In the present embodiment, the compound semiconductor 508 is formed in all the openings A and in all the grooves B. However, the present invention is not limited to such a configuration. For example, the compound semiconductor 508 can be formed in some of the openings A or in a part of the grooves B.

By forming the insulator 510 to cover the compound semiconductor 508 formed in the grooves B, and forming the electronic element 512 on the compound semiconductor 508 formed in the openings A, the electronic device 500 shown in FIG. 11A and FIG. 11B can be produced. Examples of the insulator 510 include silicon oxide and silicon nitride formed by CVD or sputtering. An example of the electronic element 512 is a hetero-bipolar transistor. The electronic element 512 can be produced by an already-known production method. Of all the compound semiconductors 508 formed in the openings A, the compound semiconductor(s) 508 not subjected to device processing in later steps can be covered with insulator(s) 510.

Figure 13:
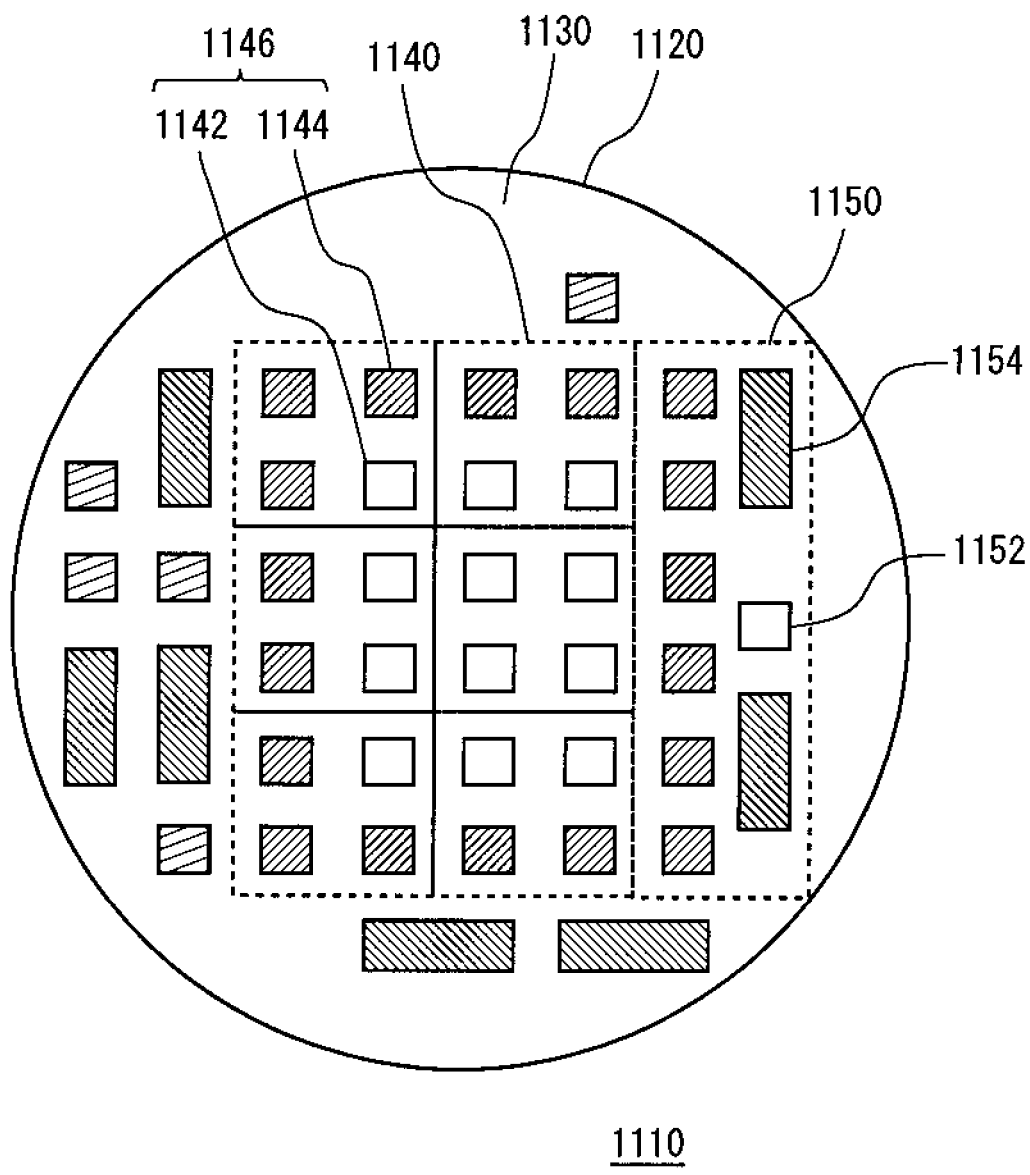
FIG. 13 shows an exemplary plan view of a semiconductor wafer 1110.

FIG. 13 shows a plan view of another embodiment of the semiconductor wafer 1110. Another arrangement example of the opening is explained with reference to FIG. 13. As shown in FIG. 13, the semiconductor wafer 1110 comprises an inhibition layer 1130, an opening region 1140, and an opening region 1150.

Each of the plurality of opening regions 1140 has a plurality of openings 1146 in the same arrangement as the other opening regions. Some of the plurality of openings 1146 are element forming opening(s) 1142 in which an electronic element is to be formed. The other of the plurality of openings 1146 are dummy opening(s) 1144 in which no electronic element is to be formed.

In the opening region 1150, a plurality of openings are disposed in a different arrangement than that of the openings of the opening regions 1140. For example, the element forming openings 1152 and the dummy openings 1154 are disposed in the opening regions 1150. The element forming openings 1152 can be provided with electronic elements. In the dummy opening 1154, no electronic element can be formed due to an insulator disposed on the compound semiconductor formed in the dummy opening 1154. Note that some of the openings of the opening regions 1150 can be arranged in position(s) corresponding to the opening region(s) 1140.

The semiconductor wafer 1110 has a base wafer 1120 similar to the base wafer 120 or the base wafer 420. Therefore, the configuration similar to the configuration of the semiconductor wafer 110 or the semiconductor wafer 410 is not explained in the following. The opening regions 1140 have the same configuration as the opening regions 140, and so are not explained in the following.

The element forming openings 1142 have the same configuration as the element forming openings 142 and the element forming openings 442, and so are not explained in the following. Inside the element forming opening 1142, the first compound semiconductor having a configuration similar to the configuration of the first compound semiconductor 160 and the first compound semiconductor 470 is formed. Note that the first compound semiconductor is not shown in FIG. 13.

The dummy openings 1144 correspond to the dummy openings 444. Inside the dummy opening 1144, a second compound semiconductor having a configuration similar to that of the second compound semiconductor 472, and an insulator having a configuration similar to that of the insulator 482 are formed. Inside the dummy opening 1144, an insulator having a configuration similar to that of the insulator 484 can be formed.

The element forming opening 1152 has a fourth compound semiconductor grown in the same process as the growth process of the first compound semiconductor in the element forming opening 1142. The fourth compound semiconductor has a configuration similar to that of the first compound semiconductor 160 or the first compound semiconductor 470.

A second seed crystal having a configuration similar to that of the first seed crystal layer can be disposed inside the element forming opening 1152. Inside the element forming opening 1152, the base wafer 1120, the second seed crystal, and the fourth compound semiconductor are arranged in a direction substantially vertical to the main plane of the base wafer 1120, in this order. Note that FIG. 13 does not show the fourth compound semiconductor and the second seed crystal.

Inside the dummy opening 1154, the second insulator and a fifth compound semiconductor formed in the same process as the crystal growth process of the first compound semiconductor in the element forming opening 1142 are formed. Inside the dummy opening 1154, the base wafer 1120, the fifth compound semiconductor, and the second insulator are arranged in a direction substantially vertical to the main plane of the base wafer 1120, in this order.

The second insulator has a configuration similar to that of the insulator 484. The second insulator is formed in the dummy opening 1154, after removal of the compound semiconductor having been grown in the dummy opening 1154 in the same process as the crystal growth process of the first compound semiconductor in the element forming opening 1142.

A technology of selectively growing a semiconductor on a part of the base wafer is useful for improving the performance of the electronic device. However, the important parameters for forming an electronic device (e.g., the growth rate, the crystal composition, the doping concentration, and the three dimensional shape of the crystal for a crystal thin film) depend on the size, shape, etc. of the selective growth section and the inhibition layer. Consequently, these crystal growth conditions have to be taken into consideration in designing an electronic device, and so a high level of techniques and experiences have been conventionally required to grow the crystal thin film having a uniform quality and a uniform thickness on each position for a corresponding electronic device.

According to the above-described embodiment, by using a semiconductor wafer 410 having a plurality of opening regions, with each opening region including a plurality of openings in same positions as one another, the burden of designing related to the growth of the crystal thin film in different positions for respective electronic devices 400 is greatly reduced during designing and developing the electronic device 400. As a result, the designing burden incurred from the stages of design and test production of the electronic device 400 up to creation of the final product as well as the time required from the start of the design to the start of the production are greatly reduced.

Moreover, in the production of a semiconductor wafer 110 having a selectively grown crystal thin film, product standardization becomes possible by preparing a semiconductor wafer 110 having a plurality of opening regions, with each opening region including a plurality of openings in same positions as one another. This is advantageous over a case of designing and producing semiconductor wafers dedicated to respective electronic device designs. This is industrially advantageous because the cost of a high-performance semiconductor wafer 110 is reduced.

EMBODIMENT EXAMPLES

Embodiment Example No. 1

According to the procedures shown in FIG. 5 to FIG. 10, an electronic device 400 has been produced. A commercially-available SOI wafer was prepared as a base wafer 420. As an inhibition layer 430, a silicon oxide layer was prepared by CVD. The thickness of the silicon oxide layer was 1 μm. A plurality of openings were formed by photolithography. The plurality of openings were formed at constant intervals in both of the two directions orthogonal to each other, and have the same plane shape. The openings, each being a square whose a side has a length of 10 μm in the plan view, were arranged in a constant pitch of 30 μm therebetween. Since a side of the opening is 10 μm, the interval between two neighboring openings is 20 μm. The opening was designed to have a thickness of a seed crystal of 0.5 μm and a thickness of GaAs of 3 μm.

The seed crystal of Ge was formed inside the opening. The seed crystal of Ge was formed by CVD using halogen. The seed crystal was deposited under a condition of growth temperature of 600 degrees centigrade and pressure in the reaction chamber of 2.6 kPa. After the deposition, the seed crystal was annealed at 850 degrees centigrade for 10 minutes, and then at 780 degrees centigrade for 10 minutes. The thickness of the resulting seed crystal was 0.5 μm, as designed.

GaAs in contact with the seed crystal was formed inside the opening. GaAs was formed by MOCVD using trimethyl gallium and arsine as a source gas. GaAs was deposited under a condition of growth temperature of 650 degrees centigrade and pressure in the reaction chamber of 9.9 kPa. The thickness of GaAs was 2.5 μm, which was within the range of designing error.

Thereafter, a part of GaAs in some of the openings was removed by etching. GaAs and the seed crystal in the other of the openings were removed together with the silicon oxide layer. Then, a new silicon oxide layer was formed in the opening(s) from which a part of GaAs was removed and on the region(s) from which the silicon oxide layer was removed together with GaAs and the seed crystal. As a result, the semiconductor wafer 410 was produced. In addition, a HBT was formed on each of a plurality of GaAs of the semiconductor wafer 410. The HBTs were electrically coupled with each other, thereby producing the electronic device 400.

As a result of examination of the surface of the active layer using the etch-pit method, no defect was found on the surface of the active layer. Moreover, the observation on the cross section and the inside of the first seed crystal 460 using the TEM found no defect. The electronic device 400 operated as designed.

Embodiment Example No. 2

According to the procedures shown in FIG. 5 to FIG. 8, crystal growth was conducted. A commercially-available Si wafer was prepared as a base wafer 420. As an inhibition layer 430, a silicon oxide layer was formed by a thermal oxidation method. The thickness of the silicon oxide layer was 1 µm. A plurality of openings were formed through the silicon oxide layer by photolithography. The plurality of openings having the same plane shape were formed at constant intervals. The openings, each being a square whose one side has a length of 10 µm in the plan view, were arranged in a constant pitch of 30 µm therebetween. In other words, the openings were formed at each distance of 30 µm. The Ge crystal was grown as a seed crystal to the thickness of 1 µm in the openings, and then was subjected to annealing. Thereafter, the GaAs crystal was grown.

Figure 14A:
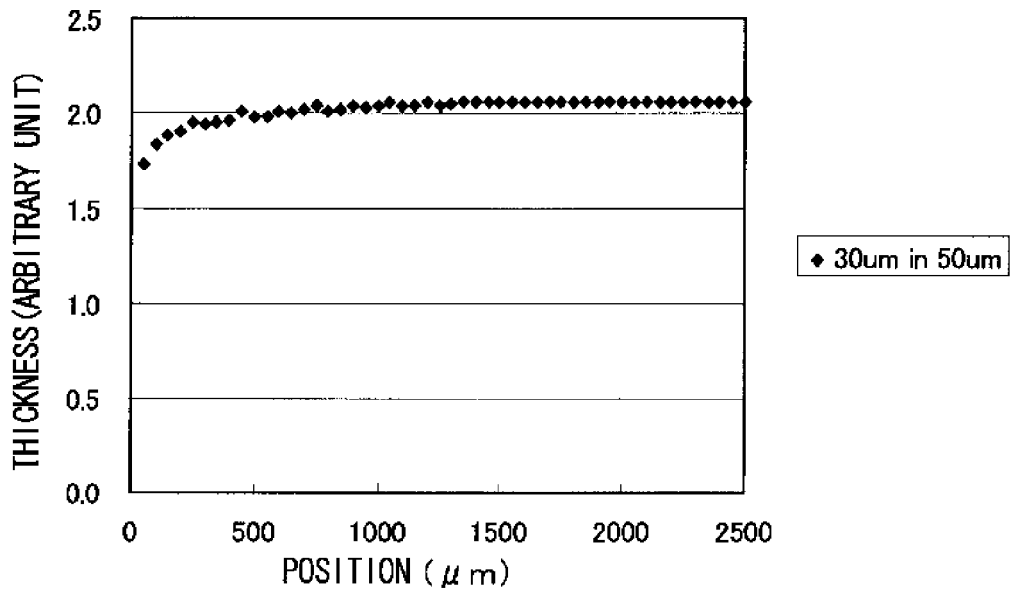
FIG. 14A shows a graph showing a thickness distribution of a compound semiconductor of the electronic device 400.
Figure 14B:
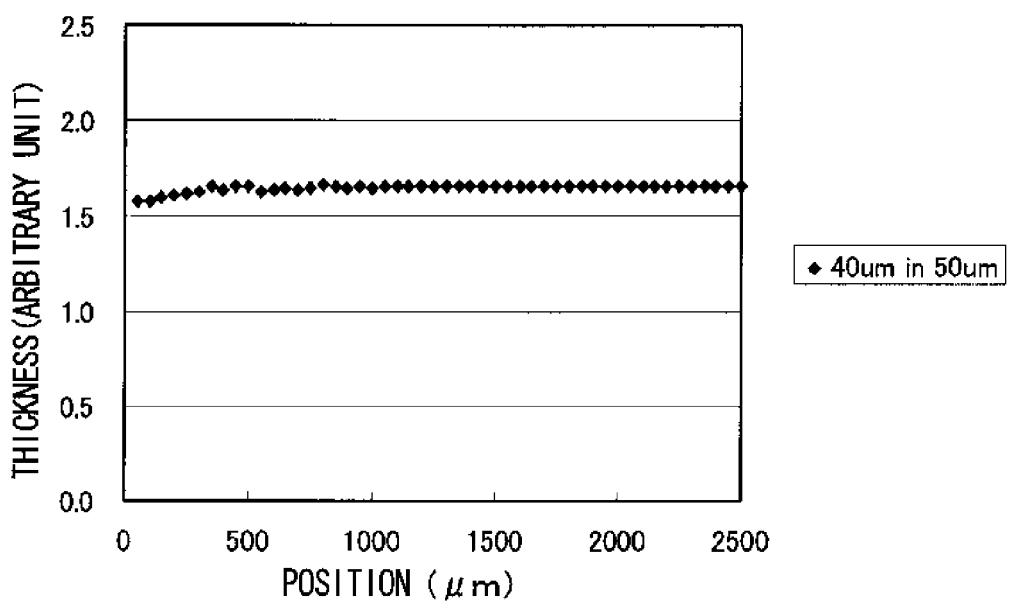
FIG. 14B shows a graph showing a thickness distribution of the compound semiconductor of the electronic device 400.

A laser microscope was used to measure the crystal growth thickness in the center of each opening in the group of regularly aligned openings. The measurement result is shown in FIG. 14A and FIG. 14B. FIG. 14A shows a result of forming the openings of 30 µm□ at the pitch of 50 µm. The lateral axis represents a distance from the edge of the opening region. The result shows reduction in thickness in the vicinity of the edge. However, as farther from the edge, the thickness is settled to a constant thickness. FIG. 14B shows a result of forming the openings of 40 µm□ at the pitch of 50 µm. The change in thickness in relation to the distance from the edge of the opening region is the same as in FIG. 14A, however the change amount and the absolute value of the thickness are different from those of FIG. 14A. Accordingly, it is confirmed that the thickness of the grown in each opening inside the opening region except for the edge is uniform. In addition, it is found that the thickness is adjustable by adjusting the size of the inhibition layer and the size of the opening.

Figure 15A:
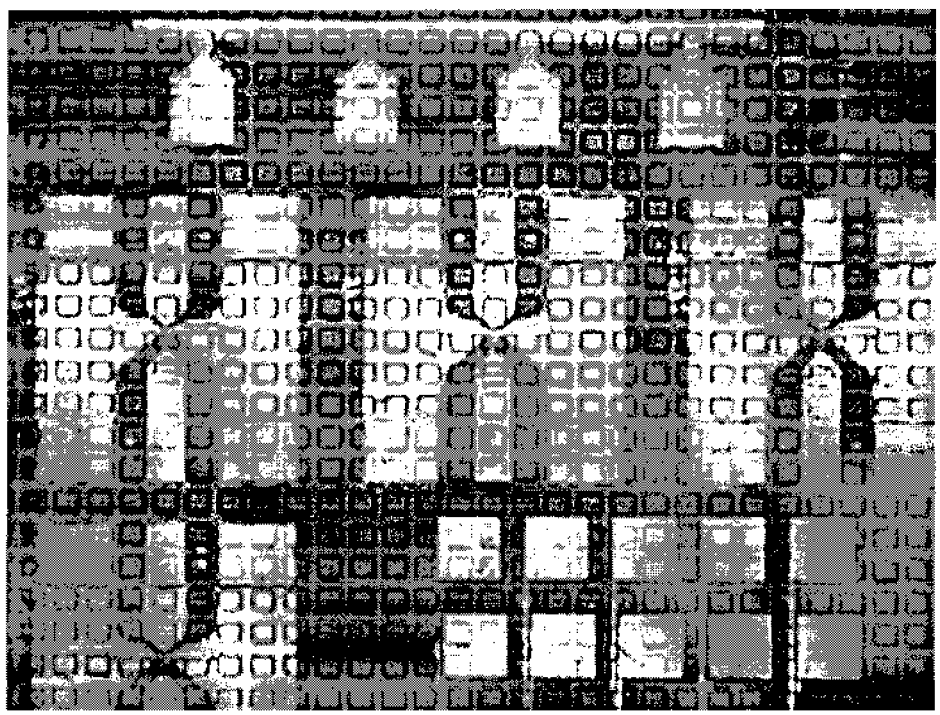
FIG. 15A shows a laser microscopic image of the electronic device 400.
Figure 15B:
FIG. 15B shows a laser microscopic image of the electronic device 400.

An HBT was formed as an electronic device 400 on the GaAs crystal formed in the above manner. FIG. 15A and FIG. 15B are laser microscopic images of the formed HBT.

Embodiment Example No. 3

According to the procedures shown in FIG. 12A to FIG. 12D, an HBT was produced as an electronic device 500. A commercially-available Si wafer was prepared as a base wafer 502. As an inhibition layer 504, a silicon oxide layer was formed by a thermal oxidation method. The thickness of the silicon oxide layer was 1 µm. A plurality of isolated inhibition layers 504 were formed by photolithography. At the same time, openings A were provided through the inhibition layers 504. The plane shape of the inhibition layer 504 was a square having a side of 40 µm, and an opening A is provided in the center of the inhibition layer 504. The plane shape of the opening A was a square having a side of 20 µm. The inhibition layers 504 were formed at the constant interval of 50 µm pitch. Since a side of the inhibition layer 504 is 40 µm, a groove B was formed between two neighboring inhibition layers 504. The width of the groove B was 10 µm. The opening A was designed such that the thickness of the seed crystal 506 is 1.0 µm, and the thickness of GaAs is 1.0 µm.

Inside the opening A, the seed crystal 506 of Ge was formed by CVD. The seed crystal 506 was deposited under a condition of growth temperature of 600 degrees centigrade and pressure in the reaction chamber of 0.5 kPa. After the deposition of the seed crystal 506, 10 repetitions of two-phase annealing in which annealing at 800 degrees centigrade for 10 minutes is followed by annealing at 680 degrees centigrade for 10 minutes were conducted. The seed crystal 506 was also formed in the groove B between two neighboring inhibition layers 504, which includes no inhibition layer 504 therein.

GaAs in contact with the seed crystal 506 was formed in the opening A and in the opening B, as a compound semiconductor 508. GaAs was formed by MOCVD using trimethyl gallium and arsine as a source gas. GaAs was deposited under a condition of growth temperature of 650 degrees centigrade and pressure in the reaction chamber of 8.0 kPa. Thereon, a hetero-bipolar transistor (HBT) structure, made of GaAs, InGaP, and InGaAs, was formed also by MOCVD. Processing was performed onto the crystal in pre-set opening(s) A by photolithography to obtain an HBT device structure, thereby producing the electronic device 500.

Figure 16A:
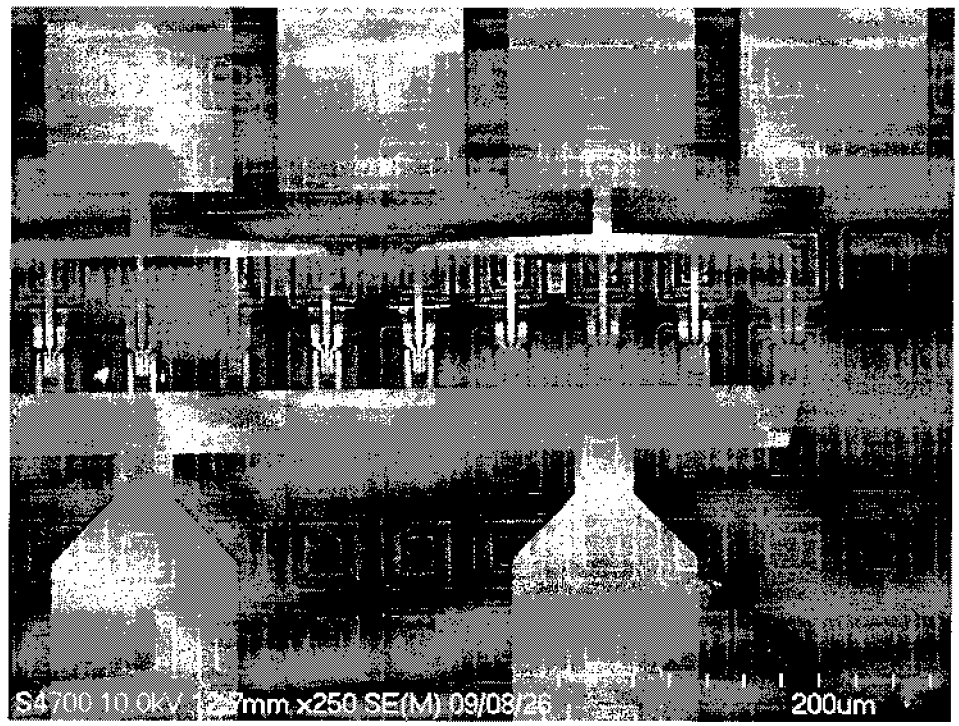
FIG. 16A shows a laser microscopic image of the electronic device 500.
Figure 16B:
FIG. 16B shows a laser microscopic image of the electronic device 500.
Figure 17:
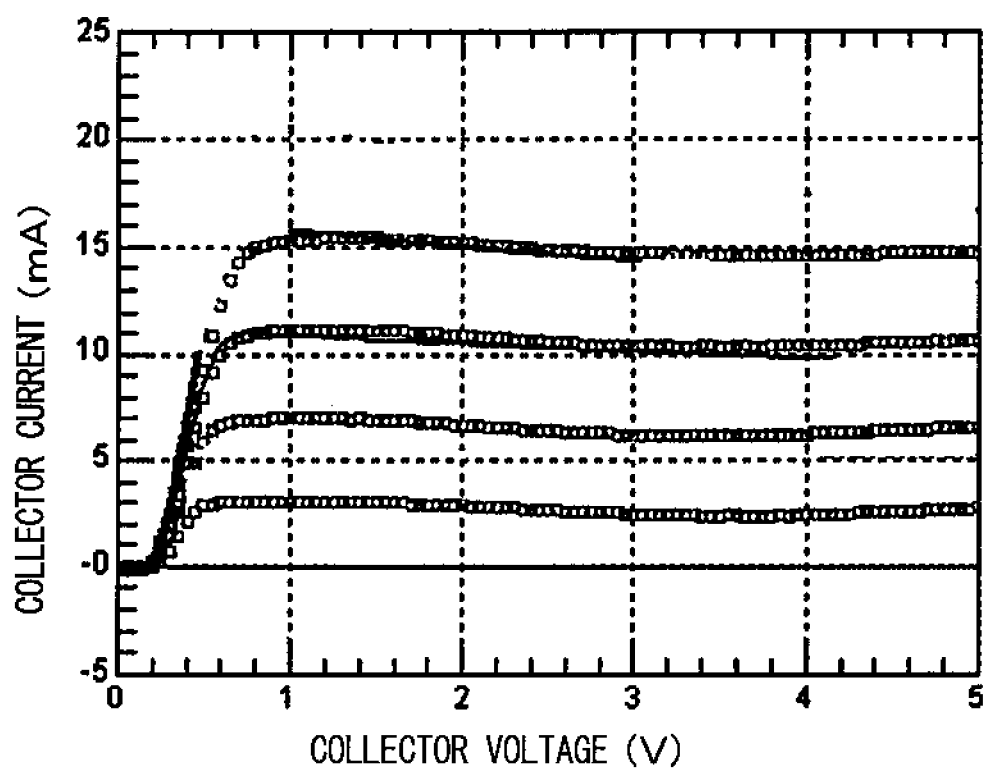
FIG. 17 is a graph showing transistor characteristics of the electronic device 500.
Figure 18:
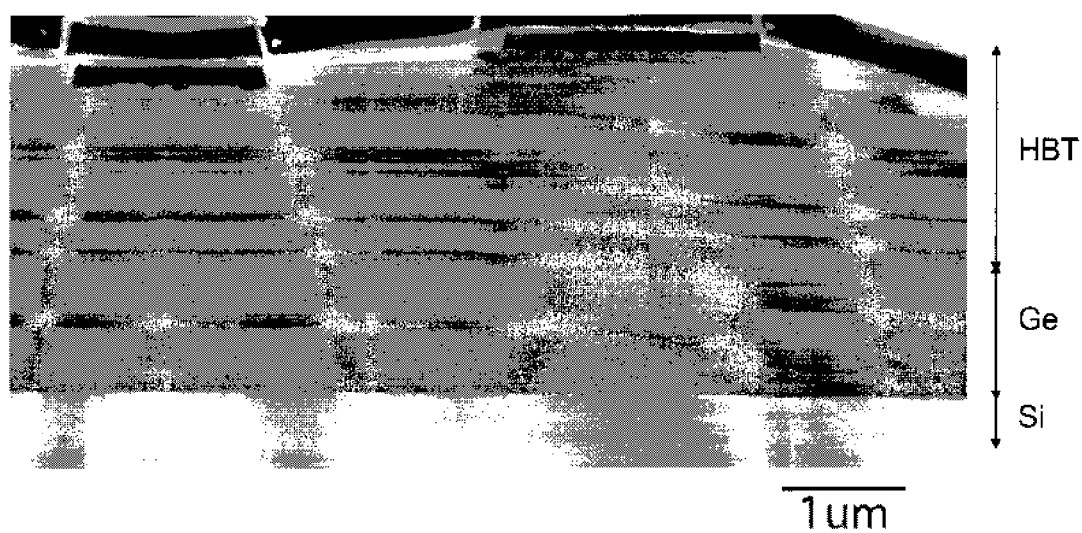
FIG. 18 is a cross-section TEM image of the electronic device 500.

FIG. 16A and FIG. 16B are laser microscopic images of the electronic device 500. FIG. 16A shows an electronic device 500 obtained by connecting, in parallel, HBT elements formed in a plurality of openings. FIG. 16B shows an electronic device 500 in which an HBT element is formed in a single opening. A current was applied to the electronic device 500, thereby confirming the transistor operation as shown in FIG. 17. FIG. 17 is a graph showing a collector current with respect to a collector voltage when the base current of the electronic device 500 is changed in the range from 37.5 µA to 150 µA. One of the electronic devices 500 was observed using a cross-sectional TEM. As a result, no dislocation was found as shown in FIG. 18.

Embodiment Example No. 4

According to the procedure of FIG. 12A, crystal growth was conducted. A commercially-available Si wafer was prepared as a base wafer 502. A silicon oxide layer was formed on the Si wafer by a thermal oxidation method. The thickness of the silicon oxide layer was 1 µm. A plurality of inhibition layers 504 were formed on the silicon oxide layer by photolithography. A square-shaped opening A was formed on the center of the inhibition layer 504 formed as a square seen from above the wafer growth plane. Then the processing was conducted so that the inhibition layers 504 were arranged at a constant interval of 50 µm pitch. The seed crystal 506 made of Ge was grown in the opening A to the thickness of 1 µm. After the annealing was conducted under the same condition as in Embodiment Example No. 3, GaAs was grown.

Figure 19A:
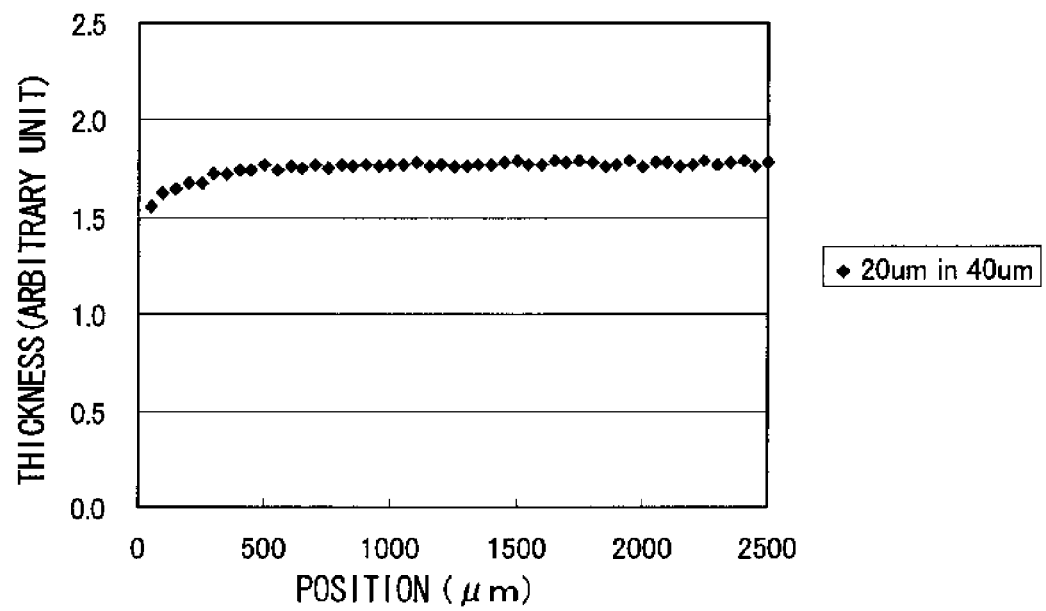
FIG. 19A is a graph showing a thickness distribution of a compound semiconductor of the electronic device 500.
Figure 19B:
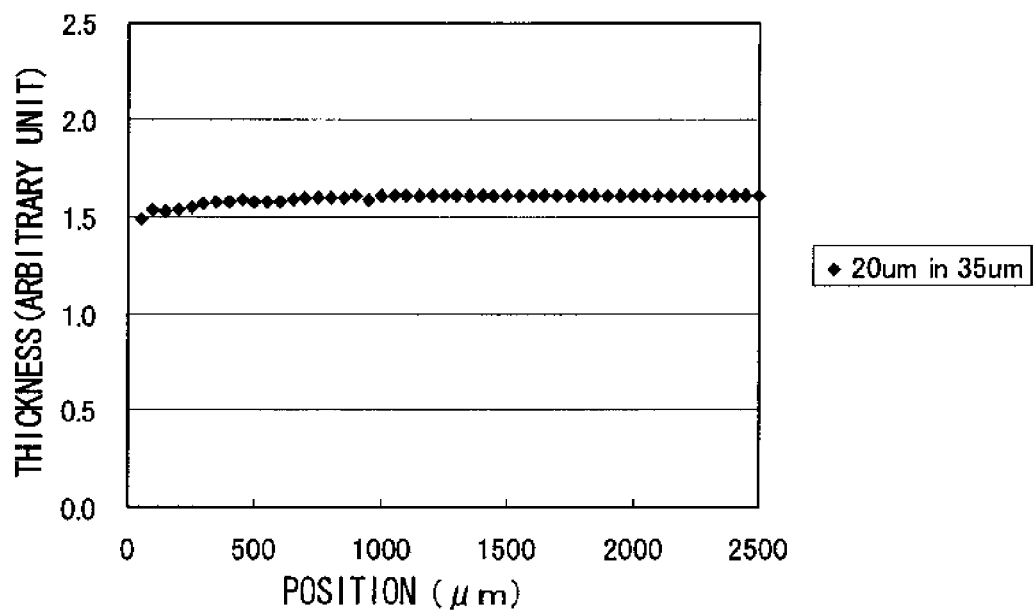
FIG. 19B is a graph showing a thickness distribution of the compound semiconductor of the electronic device 500.

A laser microscope was used to measure the crystal growth thickness in the center of each opening in the opening region. The measurement result is shown in FIG. 19A and FIG. 19B. FIG. 19A shows the result where the opening A has the length of a side of 20 µm, and the inhibition layer 504 has the length of a side of 40 µm. The lateral axis represents a distance from the edge of the opening region. The result shows reduction in thickness in the vicinity of the edge. However, as farther from the edge, the thickness is settled to a constant thickness.

Figure 19C:
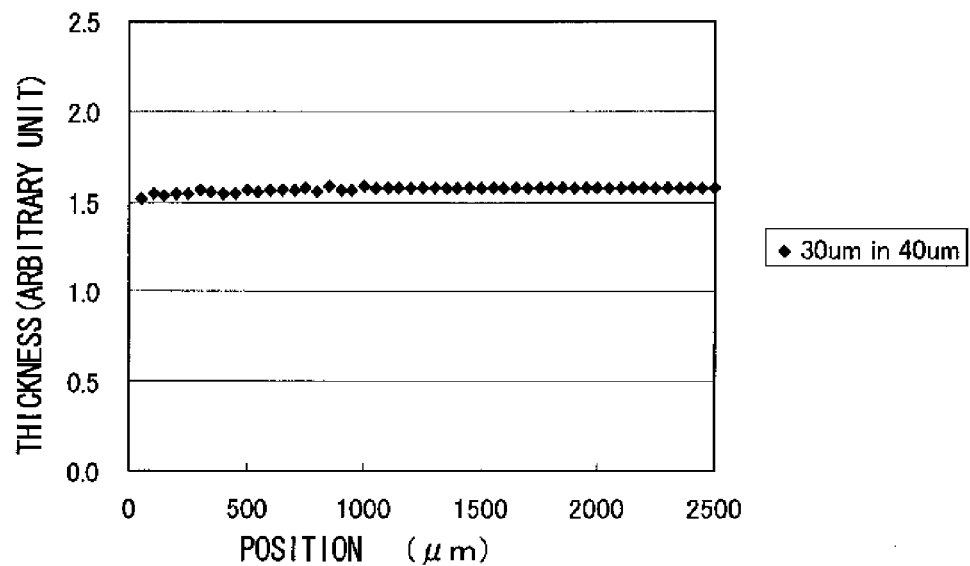
FIG. 19C is a graph showing a thickness distribution of the compound semiconductor of the electronic device 500.

FIG. 19B shows the result where the opening A has the length of a side of 20 µm, and the inhibition layer 504 has the length of a side of 35 µm. FIG. 19C shows the result where the opening A has the length of a side of 30 µm, and the inhibition layer 504 has the length of a side of 40 µm. The change in thickness in relation to the distance from the edge of the opening region in FIG. 19B and FIG. 19C is respectively the same as in FIG. 19A, however the change amount and the absolute value of the thickness are different from those of FIG. 19A. Accordingly, it is confirmed that the thickness of the grown in each opening inside the opening region except for the edge was uniform. In addition, it is found that the thickness is adjustable by adjusting the size of the inhibition layer 504 and the size of the opening A.

Comparison Example No. 1

Figure 20:
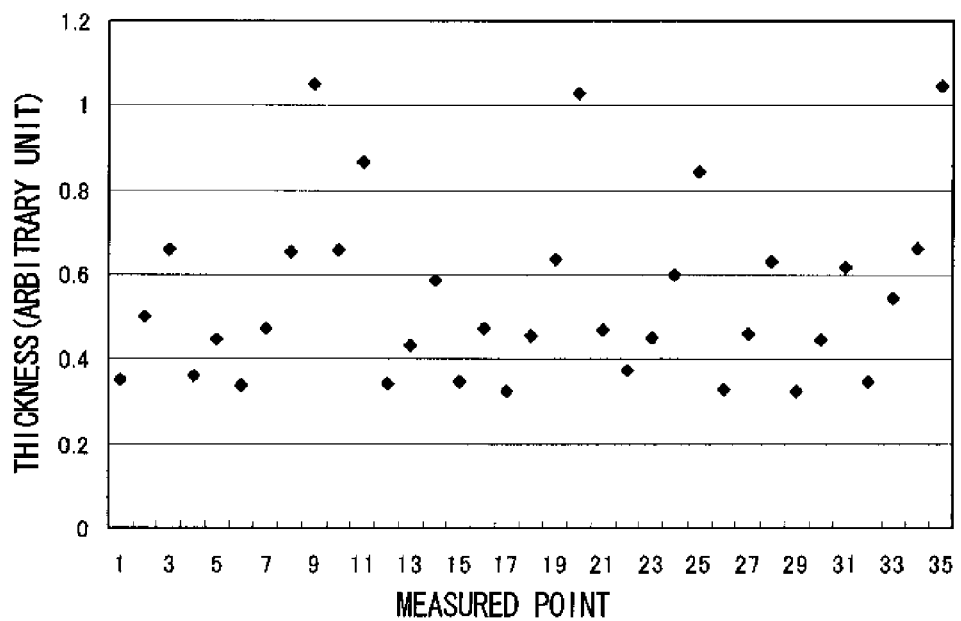
FIG. 20 is a graph showing a thickness distribution of the compound semiconductor in a comparison example.

A seed crystal and GaAs were grown, by conducting the same processing as in Embodiment Example No. 4, except for adopting a different size of the inhibition layers, a different size of the openings, and a irregular arrangement. A laser microscope was used to measure the crystal growth thickness in the center of each opening. The measurement result is shown in FIG. 20. This result shows variations in thickness in each opening, due to the irregular arrangement of the inhibition layers and the openings.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

The invention claimed is:

1. A semiconductor wafer comprising:
   a base wafer; and
   an inhibition layer that is disposed on the base wafer as one piece or to be separate portions from each other, and inhibits growth of a crystal of a compound semiconductor, wherein
   the inhibition layer has a plurality of first opening regions that have a plurality of openings penetrating the inhibition layer and leading to the base wafer,
   each of the plurality of first opening regions includes therein a plurality of first openings disposed in the same arrangement,
   some of the plurality of first openings are first element forming openings each provided with a first compound semiconductor on which an electronic element is to be formed,
   the other of the plurality of first openings are first dummy openings in which no electronic element is to be formed, and
   no compound semiconductor having the same composition as that of the first compound semiconductor is disposed in at least some of the first dummy openings.

2. The semiconductor wafer as set forth in claim 1, wherein
   (a) a second compound semiconductor having the same composition as that of the first compound semiconductor and (b) a first insulator disposed on the second compound semiconductor are disposed in at least some of the first dummy openings.

3. The semiconductor wafer as set forth in claim 1, wherein a third compound semiconductor having the same composition as that of the first compound semiconductor and having a thickness smaller than the thickness of the first compound semiconductor is disposed in at least some of the first dummy openings.

4. The semiconductor wafer as set forth in claim 1, wherein the plurality of first openings are arranged in a lattice pattern in the plurality of first opening regions.

5. The semiconductor wafer as set forth in claim 1, wherein the plurality of first opening regions are arranged at constant intervals.

6. The semiconductor wafer as set forth in claim 1, wherein the plurality of first opening regions are arranged in a lattice pattern.

7. The semiconductor wafer as set forth in claim 1, wherein the first compound semiconductor includes a Group 3-5 compound semiconductor.

8. The semiconductor wafer as set forth in claim 1, wherein
   the base wafer is a Si wafer or an SOI wafer,
   a first seed crystal lattice-matching or pseudo lattice-matching the first compound semiconductor is further disposed on the base wafer inside the first element forming opening, and
   a crystal of the first compound semiconductor has been grown on the first seed crystal.

9. The semiconductor wafer as set forth in claim 8, wherein the first seed crystal includes $C_xSi_yGe_zSn_{1-x-y-z}$ ($0 \leq x \leq 1$, $0 \leq y \leq 1$, $0 \leq z \leq 1$, and $0 \leq x+y+z \leq 1$).

10. The semiconductor wafer as set forth in claim 1, wherein
    the inhibition layer further includes a second opening region that includes a plurality of second openings penetrating the inhibition layer and leading to the base wafer, the plurality of second openings being disposed in an arrangement different than the arrangement of the plurality of first openings disposed in the plurality of first opening regions.

11. The semiconductor wafer as set forth in claim 10, wherein
    some of the plurality of second openings are second element forming openings in which a fourth compound semiconductor is disposed, the fourth compound semiconductor being formed in the same process as the first compound semiconductor and on which an electronic element can be formed, and
    the other of the plurality of second openings are second dummy openings in which no electronic element is to be formed.

12. The semiconductor wafer as set forth in claim 11, wherein
    the base wafer is a Si wafer or an SOI wafer,
    a second seed crystal lattice-matching or pseudo lattice-matching the fourth compound semiconductor is disposed on the base wafer inside the second element forming opening, and
    the fourth compound semiconductor has been grown on the second seed crystal.

13. The semiconductor wafer as set forth in claim 12, wherein
    the second seed crystal includes $C_xSi_yGe_zSn_{1-x-y-z}$ ($0 \leq x \leq 1$, $0 \leq y \leq 1$, $0 \leq z \leq 1$, and $0 \leq x+y+z \leq 1$).

14. An electronic device in which an electronic element is formed on the first compound semiconductor of the semiconductor wafer as set forth in claim 1.

15. The electronic device as set forth in claim 14, wherein
    a plurality of the first compound semiconductors are included, each of first compound semiconductors being provided with an electronic element, and
    the electronic device further comprises:
    an interconnection electrically coupling the electronic elements to each other;
    a second compound semiconductor disposed in at least some of the first dummy openings, the second compound semiconductor having the same composition as that of the first compound semiconductor; and
    an insulator that is disposed on the second compound semiconductor and insulates the second compound semiconductor from the interconnection.

16. The electronic device as set forth in claim 14, wherein a test element for testing the electronic element is formed in a region of the base wafer, the region being different from the plurality of first opening regions.

17. The electronic device as set forth in claim 14, wherein the electronic element is at least one electronic element selected from the group consisting of an amplifying element, a switching element, an integrated circuitry element that constitutes an integrated circuit, a light emitting element that converts electricity into light, and a light receiving element that outputs a voltage or a current according to received light.

18. The electronic device as set forth in claim 14, wherein the base wafer is a Si wafer or an SOI wafer, the electronic device further comprises:

one or more silicon elements formed on a silicon crystal of the Si wafer or the SOI wafer, and at least one of the silicon elements and at least one of the electronic elements are electrically coupled.

\* \* \* \* \*